United States Patent
Oh et al.

(10) Patent No.: US 9,461,277 B2
(45) Date of Patent: Oct. 4, 2016

(54) ORGANIC LIGHT EMITTING DISPLAY APPARATUS

(71) Applicant: SAMSUNG DISPLAY CO., LTD., Yongin, Gyeonggi-Do (KR)

(72) Inventors: Eon-Seok Oh, Yongin (KR); Seung-Wook Chang, Yongin (KR); Young-Hee Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/901,529

(22) Filed: May 23, 2013

(65) Prior Publication Data

US 2014/0014924 A1 Jan. 16, 2014

(30) Foreign Application Priority Data

Jul. 10, 2012 (KR) .................. 10-2012-0075139
Dec. 26, 2012 (KR) .................. 10-2012-0153709

(51) Int. Cl.
| | |
|---|---|
| *H01L 51/56* | (2006.01) |
| *H01L 51/52* | (2006.01) |
| *H01L 27/32* | (2006.01) |
| *H01L 51/00* | (2006.01) |

(Continued)

(52) U.S. Cl.
CPC .............. *H01L 51/56* (2013.01); *C23C 14/042* (2013.01); *C23C 14/12* (2013.01); *H01L 27/3218* (2013.01); *H01L 51/0011* (2013.01); *H01L 51/52* (2013.01)

(58) Field of Classification Search
CPC ....... H01L 51/56; H01L 51/52; H01L 33/02; H01L 51/0011; H01L 27/3218; C23C 14/042
USPC ............................................. 257/59, 72, 40
See application file for complete search history.

(56) References Cited

U.S. PATENT DOCUMENTS

| | | | |
|---|---|---|---|
| 6,274,198 B1 | 8/2001 | Dautartas | |
| 6,371,451 B1 | 4/2002 | Choi | |

(Continued)

FOREIGN PATENT DOCUMENTS

| | | |
|---|---|---|
| EP | 1 413 644 A2 | 4/2004 |
| EP | 1 518 940 A1 | 3/2005 |

(Continued)

OTHER PUBLICATIONS

Patent Abstracts of Japan and English Machine Translation of JP 11-144865, 32 pages.

(Continued)

*Primary Examiner* — Selim Ahmed
(74) *Attorney, Agent, or Firm* — Lewis Roca Rothgerber Christie LLP

(57) ABSTRACT

An organic light emitting display apparatus includes: a substrate; an insulation layer on the substrate and including first regions that are arranged along a first direction and second regions that are adjacent to the first regions and are arranged along the first direction; first lines on the insulation layer to cover the first regions and including first organic light-emitting layers; and second lines on the insulation layer to cover the second regions and including second organic light-emitting layers different from the first organic light-emitting layers. A portion of the first regions and a portion of the second regions facing each other are not parallel to the first direction.

28 Claims, 16 Drawing Sheets

(51) Int. Cl.
*C23C 14/04* (2006.01)
*C23C 14/12* (2006.01)

(56) References Cited

U.S. PATENT DOCUMENTS

| | | |
|---|---|---|
| 6,443,597 B1 | 9/2002 | Natori |
| 6,749,906 B2 | 6/2004 | Van Slyke |
| 6,995,035 B2 | 2/2006 | Cok et al. |
| 7,495,389 B2 | 2/2009 | Noguchi et al. |
| 7,601,439 B2 | 10/2009 | Chun et al. |
| 7,776,457 B2 | 8/2010 | Lee et al. |
| 2001/0006827 A1 | 7/2001 | Yamazaki et al. |
| 2002/0017245 A1 | 2/2002 | Tsubaki et al. |
| 2002/0076847 A1 | 6/2002 | Yamada et al. |
| 2002/0168577 A1 | 11/2002 | Yoon |
| 2003/0101937 A1 | 6/2003 | Van Slyke et al. |
| 2003/0168013 A1 | 9/2003 | Freeman et al. |
| 2003/0221614 A1 | 12/2003 | Kang et al. |
| 2003/0232563 A1 | 12/2003 | Kamiyama et al. |
| 2004/0115338 A1 | 6/2004 | Yoneda |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0194702 A1 | 10/2004 | Sasaki et al. |
| 2005/0016461 A1 | 1/2005 | Klug et al. |
| 2005/0031836 A1 | 2/2005 | Hirai |
| 2005/0037136 A1 | 2/2005 | Yamamoto |
| 2005/0166842 A1 | 8/2005 | Sakamoto |
| 2005/0258741 A1* | 11/2005 | Kim ............... H01L 27/3246 313/503 |
| 2006/0066231 A1 | 3/2006 | Nishikawa et al. |
| 2006/0144325 A1 | 7/2006 | Jung et al. |
| 2006/0174829 A1 | 8/2006 | An et al. |
| 2006/0205101 A1 | 9/2006 | Lee et al. |
| 2006/0244696 A1 | 11/2006 | Jung et al. |
| 2007/0075955 A1 | 4/2007 | Jung et al. |
| 2007/0077358 A1 | 4/2007 | Jeong et al. |
| 2007/0178708 A1 | 8/2007 | Ukigaya |
| 2008/0018236 A1 | 1/2008 | Arai et al. |
| 2008/0115729 A1 | 5/2008 | Oda et al. |
| 2008/0131587 A1 | 6/2008 | Boroson et al. |
| 2008/0216741 A1 | 9/2008 | Ling et al. |
| 2009/0017192 A1 | 1/2009 | Matsuura |
| 2009/0232976 A1 | 9/2009 | Yoon et al. |
| 2010/0219427 A1* | 9/2010 | Fukuda ........................ 257/89 |
| 2010/0328197 A1 | 12/2010 | Lee et al. |
| 2011/0052791 A1 | 3/2011 | Jo et al. |
| 2011/0068331 A1 | 3/2011 | Koh et al. |
| 2011/0266944 A1* | 11/2011 | Song et al. ............... 313/504 |
| 2012/0097992 A1 | 4/2012 | Jeong |
| 2012/0107984 A1* | 5/2012 | Oh et al. ..................... 438/34 |
| 2012/0175605 A1 | 7/2012 | Shin et al. |
| 2012/0299023 A1 | 11/2012 | Lee et al. |

FOREIGN PATENT DOCUMENTS

| | | |
|---|---|---|
| JP | 04-272170 A | 9/1992 |
| JP | 11-144865 A | 5/1999 |
| JP | 2000-068054 | 3/2000 |
| JP | 2001-052862 A | 2/2001 |
| JP | 2001-093667 A | 4/2001 |
| JP | 2002-175878 A | 6/2002 |
| JP | 2003-3250 A | 1/2003 |
| JP | 2003-077662 A | 3/2003 |
| JP | 2003-157973 A | 5/2003 |
| JP | 2003-297562 A | 10/2003 |
| JP | 2004-043898 A | 2/2004 |
| JP | 2004-103269 A | 4/2004 |
| JP | 2004-103341 A | 4/2004 |
| JP | 2004-199919 A | 7/2004 |
| JP | 2005-044592 A | 2/2005 |
| JP | 2005-235568 A | 9/2005 |
| JP | 2005-293968 A | 10/2005 |
| JP | 2005-296737 A | 10/2005 |
| JP | 2006-275433 A | 10/2006 |
| JP | 2007-047293 A | 2/2007 |
| JP | 2007-242436 A | 9/2007 |
| JP | 2008-121098 A | 5/2008 |
| JP | 2009-019243 A | 1/2009 |
| JP | 2009-87910 A | 4/2009 |
| KR | 10-0257219 B1 | 2/2000 |
| KR | 10-2000-0019254 A | 4/2000 |
| KR | 10-2000-0023929 A | 5/2000 |
| KR | 2001-0030175 A | 4/2001 |
| KR | 10-2001-0039298 A | 5/2001 |
| KR | 10-2001-0059939 A | 7/2001 |
| KR | 10-2002-0000201 A | 1/2002 |
| KR | 10-2002-0050922 A | 6/2002 |
| KR | 10-2002-0090934 A | 12/2002 |
| KR | 10-2002-0091457 A | 12/2002 |
| KR | 10-0405080 B1 | 11/2003 |
| KR | 10-2003-0091947 A | 12/2003 |
| KR | 10-2003-0093959 A | 12/2003 |
| KR | 10-2004-0050045 A | 6/2004 |
| KR | 10-2004-0069281 A | 8/2004 |
| KR | 10-2004-0084747 A | 10/2004 |
| KR | 10-0463212 B1 | 12/2004 |
| KR | 10-0483487 B1 | 4/2005 |
| KR | 10-0520159 B1 | 10/2005 |
| KR | 10-2006-0008602 A | 1/2006 |
| KR | 10-2006-0018745 A | 3/2006 |
| KR | 10-2006-0045225 A | 5/2006 |
| KR | 10-2006-0051746 A | 5/2006 |
| KR | 10-2006-0053926 A | 5/2006 |
| KR | 10-2006-0059323 A | 6/2006 |
| KR | 10-2006-0073367 A | 6/2006 |
| KR | 10-2006-0080475 A | 7/2006 |
| KR | 10-2006-0080481 A | 7/2006 |
| KR | 10-2006-0080482 A | 7/2006 |
| KR | 10-2006-0083510 A | 7/2006 |
| KR | 10-2006-0104675 A | 10/2006 |
| KR | 10-2006-0104677 A | 10/2006 |
| KR | 10-2006-0109627 A | 10/2006 |
| KR | 10-0635903 B1 | 10/2006 |
| KR | 10-2006-0114477 A | 11/2006 |
| KR | 10-2006-0114573 A | 11/2006 |
| KR | 10-0646160 B1 | 11/2006 |
| KR | 10-0687007 B1 | 2/2007 |
| KR | 10-2007-0025164 A | 3/2007 |
| KR | 10-0696547 B1 | 3/2007 |
| KR | 10-0697663 B1 | 3/2007 |
| KR | 10-0698033 B1 | 3/2007 |
| KR | 10-0700466 B1 | 3/2007 |
| KR | 10-2007-0035796 A | 4/2007 |
| KR | 10-2007-0037848 A | 4/2007 |
| KR | 10-0711885 B1 | 4/2007 |
| KR | 10-2007-0050793 A | 5/2007 |
| KR | 10-0723627 B1 | 6/2007 |
| KR | 10-0726132 B1 | 6/2007 |
| KR | 10-2007-0078713 A | 8/2007 |
| KR | 10-2007-0080635 A | 8/2007 |
| KR | 10-2007-0101842 A | 10/2007 |
| KR | 10-2007-0105595 A | 10/2007 |
| KR | 10-0770653 B1 | 10/2007 |
| KR | 10-2008-0001184 A | 1/2008 |
| KR | 10-0797787 B1 | 1/2008 |
| KR | 10-0800125 B1 | 1/2008 |
| KR | 10-0815265 B1 | 3/2008 |
| KR | 10-0823508 B1 | 4/2008 |
| KR | 10-0827760 B1 | 5/2008 |
| KR | 10-0839380 B1 | 6/2008 |
| KR | 10-2008-0060400 A | 7/2008 |
| KR | 10-2008-0061132 A | 7/2008 |
| KR | 10-2008-0062212 A | 7/2008 |
| KR | 10-2008-0088737 A | 10/2008 |
| KR | 10-2009-0017910 A | 2/2009 |
| KR | 10-2009-0038733 A | 4/2009 |
| KR | 10-2009-0097453 A | 9/2009 |
| KR | 10-0961110 B1 | 6/2010 |
| KR | 10-2010-0138139 A | 12/2010 |
| KR | 10-2011-0021090 A | 3/2011 |
| KR | 10-2011-0022512 A | 3/2011 |
| KR | 10-2011-0032589 A | 3/2011 |

(56) References Cited

FOREIGN PATENT DOCUMENTS

| KR | 10-2011-0120213 A | 11/2011 |
|---|---|---|
| KR | 10-2011-0138787 A | 12/2011 |
| KR | 10-2012-0042155 A | 5/2012 |
| KR | 10-2012-0080855 A | 7/2012 |
| KR | 10-2012-0131545 A | 12/2012 |

OTHER PUBLICATIONS

Patent Abstracts of Japan and English Machine Translation of JP 2007-242436 A, 26 pages.
Korean Reg. Det. Certificate dated Nov. 30, 2011 for Application No. KR 10-2009-0056530, 5 pages.
Patent Abstracts of Japan and English Machine Translation of JP 2001-052862 A, 20 pages.
Patent Abstracts of Japan and English Machine Translation of JP 2003-3250 A, 25 pages.
Korean Patent Abstracts, Publication No. 10-2002-0086047 A, dated Nov. 18, 2002, for corresponding Korean Patent No. 10-0405080, 2 pages.
Korean Patent Abstracts, Publication No. 10-2002-0088662 A, dated Nov. 29, 2002, for corresponding Korean Patent No. 10-0463212, 2 pages.
Korean Patent Abstracts, Publication No. 10-2005-0045619 A, dated May 17, 2005, for corresponding Korean Patent No. 10-0520159, 2 pages.
Korean Patent Abstracts, Publication No. 10-2004-0062203 A, dated Jul. 7, 2004, for corresponding Korean Patent No. 10-0646160, 2 pages.
Korean Patent Abstracts, Publication No. 10-2006-0101987 A, dated Sep. 27, 2006, for corresponding Korean Patent No. 10-0687007, 2 pages.
Korean Patent Abstracts, Publication No. 10-2002-0056238 A, dated Jul. 10, 2002, for corresponding Korean Patent No. 10-0698033, 2 pages.
Korean Patent Abstracts, Publication No. 10-2005-0078637 A, dated Aug. 5, 2005, for corresponding Korean Patent No. 10-0700466, 2 pages.
Korean Patent Abstracts, Publication No. 10-2007-0025164 A, dated Mar. 8, 2007, for corresponding Korean Patent No. 10-0711885, 2 pages.
Korean Patent Abstracts, Publication No. 10-2002-0034272 A, dated May 9, 2002, for corresponding Korean Patent No. 10-0726132, 2 pages.
Korean Patent Abstracts, Publication No. 10-2006-0126267 A, dated Dec. 7, 2006, for corresponding Korean Patent No. 10-0797787, 2 pages.
Korean Patent Abstracts, Publication No. 2008-0002189 A, dated Jan. 4, 2008, for corresponding Korean Patent No. 10-0800125 B1, 1 page.
Korean Patent Abstracts, Publication No. 10-2007-0050793 A, dated May 16, 2007, for corresponding Korean Patent No. 10-0815265, 2 pages.
Korean Patent Abstracts, Publication No. 10-2001-0062735 A, dated Jul. 7, 2001, for corresponding Korean Patent No. 10-0827760, 2 pages.
Korean Patent Abstracts, Publication No. 10-2008-0038650 A, dated May 7, 2008, for corresponding Korean Patent No. 10-0839380, 2 pages.
Korean Patent Abstracts, Publication No. 10-2010-0027524 A, dated Mar. 11, 2010, for corresponding Korean Patent No. KR 10-0961110, 1 page.

\* cited by examiner

ORGANIC LIGHT EMITTING DISPLAY APPARATUS

CROSS-REFERENCE TO RELATED PATENT APPLICATIONS

This application claims priority to and the benefit of Korean Patent Application No. 10-2012-0075139, filed on Jul. 10, 2012, and Korean Patent Application No. 10-2012-0153709, filed on Dec. 26, 2012, in the Korean Intellectual Property Office, the disclosures of both of which are incorporated herein in their entirety by reference.

BACKGROUND

1. Field

The present invention relates to an organic light emitting display apparatus and a method of manufacturing of the same.

2. Description of the Related Art

Organic light-emitting display devices have wider viewing angles, better contrast characteristics, and faster response speeds than other display devices, and thus have drawn attention as a next-generation display device.

An organic light-emitting display device includes intermediate layers, including an emission layer disposed between a first electrode and a second electrode that are arranged opposite to each other. The electrodes and the intermediate layers may be formed using various methods, one of which is an independent deposition method. When an organic light-emitting display device is manufactured by using the deposition method, a fine metal mask (FMM) having the same pattern as that of an organic layer to be formed is disposed to closely contact a substrate on which the organic layer and the like are formed, and an organic layer material is deposited on the FMM to form the organic layer having the desired pattern.

However, the deposition method using such an FMM presents difficulties in manufacturing larger organic light-emitting display devices using a large mother glass. For example, when such a large mask is used, the mask may bend due to its own weight, thereby distorting a pattern. Such disadvantages are not conducive for the recent trend towards high-definition patterns.

Moreover, processes of aligning a substrate and an FMM to closely contact each other, performing deposition thereon, and separating the FMM from the substrate are time-consuming, resulting in a long manufacturing time and low production efficiency.

Information disclosed in this Background section was known to the inventors of the present invention before achieving the present invention or is technical information acquired in the process of achieving the present invention. Therefore, it may contain information that does not form the prior art or information that was already known in this country to a person of ordinary skill in the art prior to the time the present invention was made by the inventors.

SUMMARY

Embodiments according to the present invention provide a method of manufacturing an organic light emitting display apparatus that is suitable for use in the mass production of a large substrate and enables high-definition patterning and organic light-emitting display devices manufactured using the method.

According to an aspect of the present invention, there is provided an organic light emitting display apparatus including: a substrate; an insulation layer on the substrate and including first regions that are arranged along a first direction and second regions that are adjacent to the first regions and are arranged along the first direction; first lines on the insulation layer to cover the first regions and including first organic light-emitting layers; and second lines on the insulation layer to cover the second regions and including second organic light-emitting layers different from the first organic light-emitting layers, wherein a portion of the first regions and a portion of the second regions facing each other are not parallel to the first direction.

The portions of the first regions and the second regions facing each other may not be parallel to edges of the first lines and the second lines.

The first regions and the second regions may have polygonal shapes with angled corners, and an angled corner may be located at where the portions of the first regions and the second regions face each other.

The first regions and the second regions may have shapes including curved lines, and at least one of the curved lines may be located at where the portions of the first regions and the second regions face each other.

The portions of the first regions and the second regions facing each other may not be parallel to each other.

The first lines and the second lines may overlap each other at least partially.

The first regions and the second regions may have openings formed in the insulation layer.

The first organic light-emitting layer may be formed by using an organic layer deposition apparatus, and a slanted side between top and bottom sides of the first organic light-emitting layer that is farther from a center of the first region may be longer than another slanted side between the top and bottom sides.

The first organic light-emitting layer may be formed by using an organic layer deposition apparatus, and a length of a slanted side between top and bottom sides of the first organic light-emitting layer formed farther from a center of the first region may be larger than lengths of slanted sides between respective top and bottom sides of the other first organic light-emitting layers formed close to the center of the first region.

The first organic light-emitting layer may be formed by using an organic layer deposition apparatus, and two opposite slanted sides between top and bottom sides of the first organic light-emitting layer at a center of the first region may have substantially the same length.

The first organic light-emitting layer may be formed by using an organic layer deposition apparatus, and the first organic light-emitting layers at the first region may be substantially symmetrically arranged about a center of the first region.

The substrate may have a size of 40 inches or more.

The first and second organic light-emitting layers may have a non-uniform thickness.

According to another aspect of the present invention, a method of manufacturing an organic light emitting display apparatus is provided. The method includes: forming an insulation layer on a substrate; forming openings that are defined as first regions arranged along a first direction and second regions that are adjacent to the first regions and are arranged along the first direction in the insulation layer; forming first lines including first organic light-emitting layers on the insulation layer to cover the first regions by moving the substrate in relation to a first deposition assembly that is spaced from the substrate, such that a first organic light-emitting material emitted from the first deposition assembly is deposited on the substrate; and forming second lines including second organic light-emitting layers different from the first organic light-emitting layers on the insulation layer to cover the second regions by moving the substrate in relation to a second deposition assembly that is spaced from the substrate, such that a second organic light-emitting material different from the first organic light-emitting material emitted from the second deposition assembly is deposited on the substrate, wherein a portion of the first regions and a portion of the second regions facing each other are not parallel to the first direction.

The first regions and the second regions may have polygonal shapes with angled corners, and an angled corner may be located at where the portions of the first regions and the second regions face each other.

The first regions and the second regions may have shapes including curved lines, and at least one of the curved lines may be located at where the portions of the first regions and the second regions face each other.

The portions of the first regions and the second regions facing each other may not be parallel to each other.

The first deposition assembly may include: a deposition source configured to emit a deposition material; a deposition source nozzle unit at one side of the deposition source and including a plurality of deposition source nozzles; and a patterning slit sheet facing the deposition source nozzle unit and including a plurality of patterning slits, and the first organic light-emitting material emitted by the deposition source may pass through the patterning slit sheet and may be deposited to form the first organic light-emitting layers.

The patterning slit sheet may be smaller than the substrate in at least one of the first direction or a second direction perpendicular to the first direction.

The plurality of deposition source nozzles may be arranged at the deposition source nozzle unit along the first direction, the plurality of patterning slits may be arranged at the patterning slit sheet along the first direction, and the first deposition assembly may further include a shielding plate assembly including a plurality of shielding plates arranged between the deposition source nozzle unit and the patterning slit sheet along the first direction and partitioning a space between the deposition source nozzle unit and the patterning slit sheet into a plurality of deposition spaces.

The plurality of deposition source nozzles may be arranged at the deposition source nozzle unit along the first direction, and the plurality of patterning slits may be arranged at the patterning slit sheet along a second direction perpendicular to the first direction.

The deposition source, the deposition source nozzle unit, and the patterning slit sheet may be connected to one another via a connecting member and may be formed as a single body.

The connecting member may guide a path in which the deposition material moves.

The forming of the first lines and the forming of the second lines may respectively include depositing on the substrate the first organic light-emitting material and the second organic light-emitting material emitted respectively by the deposition source of the first deposition assembly and a deposition source of the second deposition assembly while the substrate is spaced from and is being moved with respect to the first and second deposition assemblies of a thin-film deposition apparatus. The thin-film deposition apparatus may include: a conveyer unit including a transfer unit on which the substrate is fixed to move therewith; a first conveyer unit, which moves the transfer unit on which the substrate is fixed in a first direction; and a second conveyer unit, which moves the transfer unit from which the substrate is detached after deposition in a direction opposite to the first direction; a loading unit in which the substrate is fixed to the transfer unit; a deposition unit including a chamber maintained at a vacuum, and the first and second deposition assemblies; and an unloading unit in which the substrate is detached from the transfer unit after the substrate passes through the deposition unit and deposition thereon is completed.

The transfer unit may be configured to move back and forth between the first conveyer unit and the second conveyer unit, and the substrate fixed to the transfer unit may be spaced apart from the first and second deposition assemblies while being transported by the first conveyer unit.

The first conveyer unit may move the transfer unit to the loading unit, the deposition unit, and the unloading unit in the order stated.

The first conveyer unit and the second conveyer unit may pass through the deposition unit.

The first conveyer unit and the second conveyer unit may be arranged next to each other in a vertical direction.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
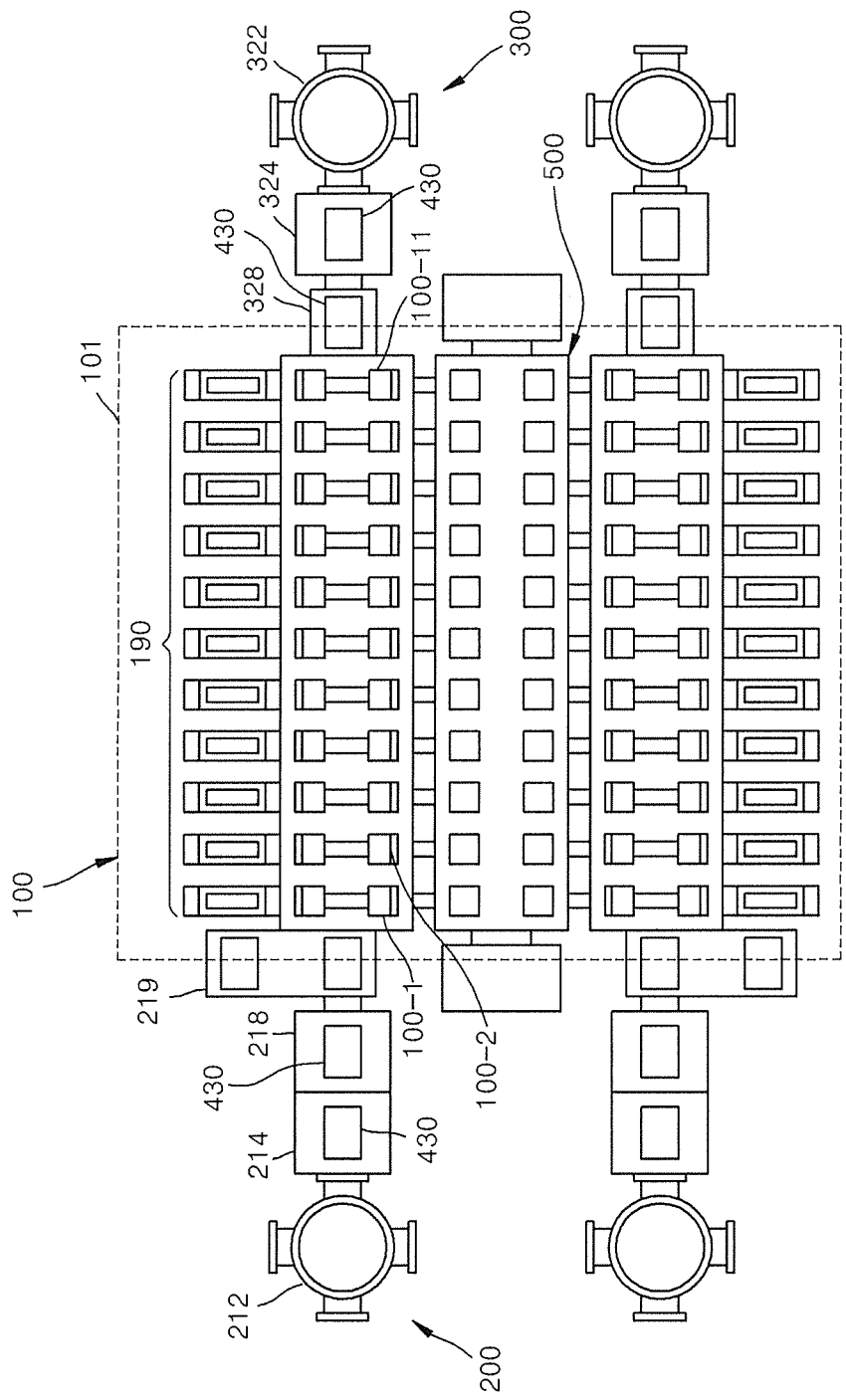
FIG. 1 is a schematic plan view illustrating a structure of a thin-film deposition apparatus according to an embodiment of the present invention.

References will now be made in detail to embodiments of the present invention, examples of which are illustrated in the accompanying drawings, wherein like reference numerals refer to the like elements throughout. The embodiments are described below in order to explain aspects of the present invention by referring to the figures. Expressions such as "at least one of," when preceding a list of elements, modify the entire list of elements and do not modify the individual elements of the list.

Figure 2:
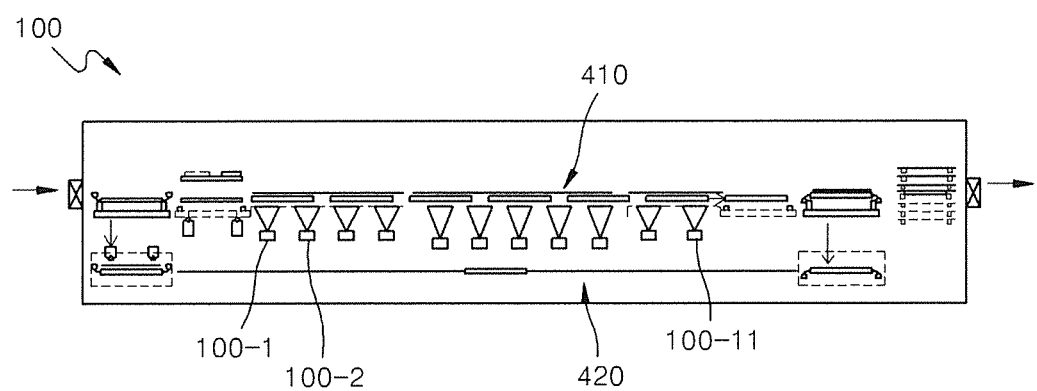
FIG. 2 is a schematic side view of a deposition unit of the thin-film deposition apparatus of FIG. 1, according to an embodiment of the present invention.

FIG. 1 is a schematic plan view illustrating a structure of a thin-film deposition apparatus (e.g., an organic layer deposition apparatus) 1 according to an embodiment of the present invention. FIG. 2 is a schematic side view of a deposition unit 100 of the thin-film deposition apparatus 1 of FIG. 1, according to an embodiment of the present invention.

Figure 3:
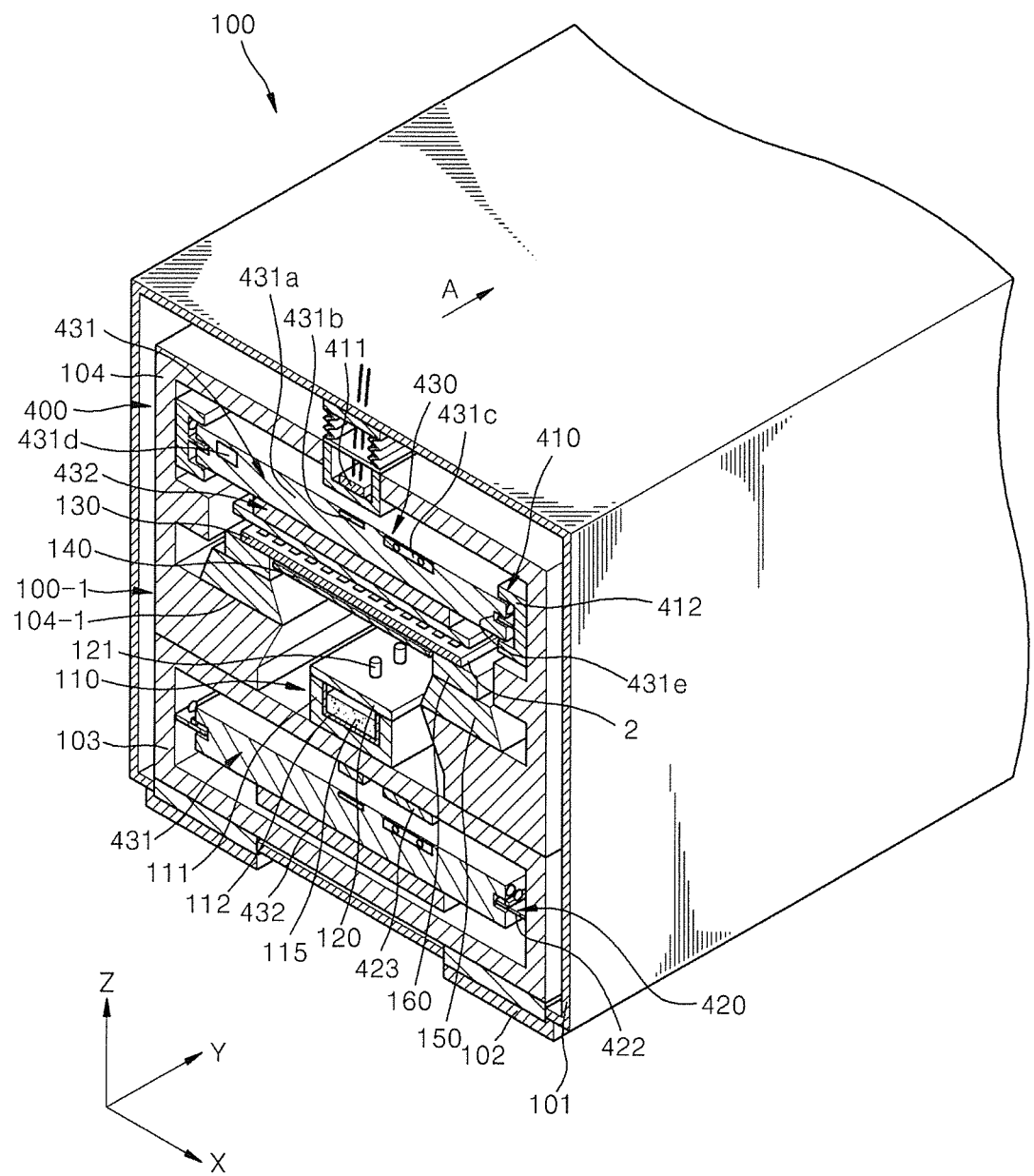
FIG. 3 is a schematic perspective view showing the deposition unit of FIG. 1.
Figure 4:
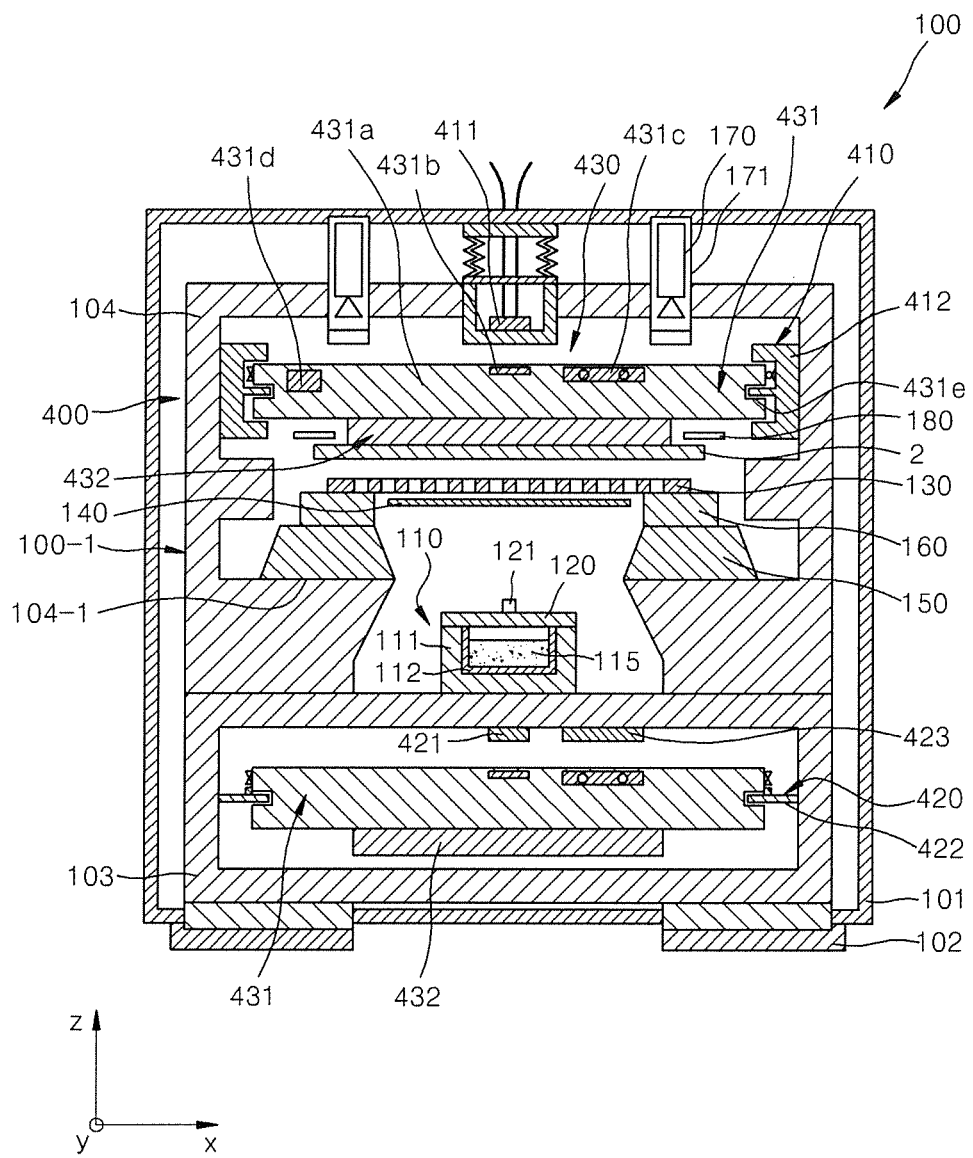
FIG. 4 is a schematic sectional view of the deposition unit of FIG. 3.

Referring to FIGS. 1 and 2, the thin-film deposition apparatus 1 includes the deposition unit 100, a loading unit 200, an unloading unit 300, and a conveyer unit 400 (refer to FIGS. 3 and 4).

The loading unit 200 may include a first rack 212, a transport chamber 214, a first inversion chamber 218, and a buffer chamber 219.

A plurality of substrates 2 (for example, one substrate 2 is shown in FIGS. 3-9) onto which a deposition material has not yet been applied are stacked up on the first rack 212. A transport robot included in the transport chamber 214 picks up one of the substrates 2 from the first rack 212, places it on a transfer unit 430 transferred by a second conveyer unit 420, and moves the transfer unit 430 on which the substrate 2 is placed into the first inversion chamber 218.

The first inversion chamber 218 is located adjacent to the transport chamber 214. The first inversion chamber 218 includes a first inversion robot that inverts the transfer unit 430 and then loads it on a first conveyer unit 410 of the deposition unit 100.

Referring to FIG. 1, the transport robot of the transport chamber 214 places one of the substrates 2 on a top surface of the transfer unit 430, and the transfer unit 430 on which the substrate 2 is placed is then transferred into the first inversion chamber 218. The first inversion robot of the first inversion chamber 218 inverts the transfer unit 430 so that the substrate 2 is turned upside down in the deposition unit 100.

The unloading unit 300 is configured to operate in an opposite manner to the loading unit 200 described above. Specifically, a second inversion robot in a second inversion chamber 328 inverts the transfer unit 430, which has passed through the deposition unit 100 while the substrate 2 is placed on the transfer unit 430, and then moves the transfer unit 430 on which the substrate 2 is placed into an ejection chamber 324. Then, an ejection robot takes the transfer unit 430 on which the substrate 2 is placed out of the ejection chamber 324, separates the substrate 2 from the transfer unit 430, and then loads the substrate 2 on a second rack 322. The transfer unit 430, separated from the substrate 2, is returned to the loading unit 200 via the second conveyer unit 420.

However, the present invention is not limited to the above example. For example, when placing the substrate 2 on the transfer unit 430, the substrate 2 may be fixed (or attached) onto a bottom surface of the transfer unit 430 and then moved into the deposition unit 100. In such an embodiment, for example, the first inversion robot of the first inversion chamber 218 and the second inversion robot of the second inversion chamber 328 may be omitted.

The deposition unit 100 may include at least one chamber for deposition. In one embodiment, as illustrated in FIGS. 1 and 2, the deposition unit 100 includes a chamber 101 in which a plurality of organic layer deposition assemblies (100-1)(100-2) . . . (100-n) may be located. Referring to FIG. 1, 11 organic layer deposition assemblies, i.e., a first organic layer deposition assembly (100-1), a second organic layer deposition assembly (100-2), through an eleventh organic layer deposition assembly (100-11), are located in the chamber 101, but the number of organic layer deposition assemblies may vary with a desired deposition material and deposition conditions. The chamber 101 is maintained in vacuum during a deposition process.

In the embodiment illustrated in FIG. 1, the transfer unit 430 with the substrate 2 fixed (or attached) thereon may be moved at least to the deposition unit 100 or may be moved sequentially to the loading unit 200, the deposition unit 100, and the unloading unit 300, by the first conveyer unit 410, and the transfer unit 430 that is separated from the substrate 2 in the unloading unit 300 may be moved back to the loading unit 200 by the second conveyer unit 420.

The first conveyer unit 410 passes through the chamber 101 when passing through the deposition unit 100, and the second conveyer unit 420 conveys (or transports) the transfer unit 430 from which the substrate 2 is separated.

In the present embodiment, the thin-film deposition apparatus 1 is configured such that the first conveyer unit 410 and the second conveyer unit 420 are respectively disposed above and below so that after the transfer unit 430, on which deposition has been completed while passing through the first conveyer unit 410, is separated from the substrate 2 in the unloading unit 300, the transfer unit 430 is returned to the loading unit 200 via the second conveyer unit 420 formed below the first conveyer unit 410, whereby the thin-film deposition apparatus 1 may have an improved space utilization efficiency.

In an embodiment, the deposition unit 100 of FIG. 1 may further include a deposition source replacement unit 190 located at a side of each organic layer deposition assembly. Although not particularly illustrated in the drawings, the deposition source replacement unit 190 may be formed as a cassette-type that may be drawn to the outside from each organic layer deposition assembly. Thus, a deposition source 110 (refer to FIG. 3) of the organic layer deposition assembly 100-1 may be easily replaced.

FIG. 3 is a schematic perspective view showing the deposition unit 100 of FIG. 1, and FIG. 4 is a schematic sectional view of the deposition unit 100 of FIG. 3. While the dotted boundary line in FIG. 1 designated with the reference numeral 101 appears to indicate a chamber that is larger than the chamber 101 as illustrated in FIGS. 3 and 4, the chamber 101 according to the embodiments of the present invention may include a single conveyer unit 400 or multiple conveyer units that are parallel to each other, and embodiments of the present invention are not limited to any particular chamber size.

Referring to FIGS. 3 and 4, the deposition unit 100 of the thin-film deposition apparatus 1 includes at least one organic layer deposition assembly 100-1 and a conveyer unit 400.

Hereinafter, an overall structure of the deposition unit 100 will be described.

The chamber 101 may be formed as a hollow box type and accommodate the at least one organic layer deposition assembly 100-1 and the transfer unit 430. In another descriptive manner, a foot 102 is formed so as to fix the deposition unit 100 on the ground, a lower housing 103 is located on the foot 102, and an upper housing 104 is located on the lower housing 103. The chamber 101 accommodates both the lower housing 103 and the upper housing 104. In this regard, a connection part of the lower housing 103 and the chamber 101 is sealed so that the inside of the chamber 101 is completely isolated from the outside. Due to the structure in which the lower housing 103 and the upper housing 104 are located on the foot 102 fixed on the ground, the lower housing 103 and the upper housing 104 may be maintained in a fixed position even though the chamber 101 is repeatedly contracted and expanded. Thus, the lower housing 103 and the upper housing 104 may serve as a reference frame in the deposition unit 100.

The upper housing 104 includes the organic layer deposition assembly 100-1 and the first conveyer unit 410 of the conveyer unit 400, and the lower housing 103 includes the second conveyer unit 420 of the conveyer unit 400. While the transfer unit 430 is cyclically moving between the first conveyer unit 410 and the second conveyer unit 420, a deposition process is continuously performed.

Hereinafter, constituents of the organic layer deposition assembly 100-1 are described in detail.

The first organic layer deposition assembly 100-1 includes the deposition source 110, a deposition source nozzle unit 120, the patterning slit sheet 130, a first stage 150, a second stage 160, a camera 170, and a sensor 180. In this regard, all the elements illustrated in FIGS. 3 and 4 may be arranged in the chamber 101 maintained in an appropriate vacuum state. This structure is used to achieve the linearity of a deposition material.

For example, in order to deposit a deposition material 115 that has been discharged from the deposition source 110 and passed through the deposition source nozzle unit 120 and the patterning slit sheet 130, onto the substrate 2 in a desired pattern, it is desirable to maintain the chamber (not shown) in the same vacuum state as that used in a deposition method using a fine metal mask (FMM). In addition, the temperature of the patterning slit sheet 130 needs to be sufficiently lower than that of the deposition source 110 because thermal expansion of the patterning slit sheet 130 by temperatures may be reduced or minimized when the temperature of the patterning slit sheet 130 is sufficiently low.

The substrate 2 on which the deposition material 115 is to be deposited is arranged in the chamber 101. The substrate 2 may be a substrate for a flat panel display device. For example, a large substrate, such as a mother glass, for manufacturing a plurality of flat panel displays, may be used as the substrate 2.

According to the present embodiment, the deposition process may be performed with the substrate 2 being moved relative to the organic layer deposition assembly 100-1.

In a conventional deposition method using an FMM, the size of the FMM is the same as that of a substrate. Thus, as the size of the substrate increases, the size of the FMM also increases. Due to these problems, it is difficult to fabricate the FMM and to align the FMM in a precise pattern by elongation of the FMM.

To address these problems, in the organic layer deposition assembly 100-1 according to the present embodiment, deposition may be performed while the organic layer deposition assembly 100-1 and the substrate 2 are moved relative to each other. In other words, deposition may be continuously performed while the substrate 2, which faces the organic layer deposition assembly 100-1, is moved in a Y-axis direction. That is, deposition is performed in a scanning manner while the substrate 2 is moved in a direction of arrow A illustrated in FIG. 3. Although the substrate 2 is illustrated as being moved in the Y-axis direction in the chamber 101 in FIG. 3 when deposition is performed, the present invention is not limited thereto. For example, deposition may be performed while the organic layer deposition assembly 100-1 is moved in the Y-axis direction and the substrate 2 is held in a fixed position.

Thus, in the organic layer deposition assembly 100-1, the patterning slit sheet 130 may be smaller (e.g., much smaller) than an FMM used in a conventional deposition method. In other words, in the organic layer deposition assembly 100-1, deposition is continuously performed, i.e., in a scanning manner, while the substrate 2 is moved in the Y-axis direction. Thus, at least one of the lengths of the patterning slit sheet 130 in X-axis and Y-axis directions may be much less than a length of the substrate 2. Because the patterning slit sheet 130 may be formed smaller (e.g., much smaller) than the FMM used in a conventional deposition method, it is relatively easy to manufacture the patterning slit sheet 130. That is, the small patterning slit sheet 130 is more suitable in view of all the manufacturing processes, including etching followed by precise elongation, welding, transferring, and washing processes, than the FMM used in a conventional deposition method. In addition, this is more suitable for manufacturing a relatively large display device.

In order to perform deposition while the organic layer deposition assembly 100-1 and the substrate 2 are moved relative to each other as described above, the organic layer deposition assembly 100-1 and the substrate 2 may be spaced apart from each other by a certain distance (e.g., a gap). This is described below in detail.

The deposition source 110 that contains and heats the deposition material 115 is located at a side opposite to a side in which the substrate 2 is located in the chamber. As the deposition material 115 contained in the deposition source 110 is vaporized, deposition is performed on the substrate 2.

The deposition source 110 includes a crucible 111 that is filled with the deposition material 115 and a heater 112 that heats the crucible 111 so as to vaporize the deposition material 115 toward a side of the crucible 111 filled with the deposition material 115, in particular, toward the deposition source nozzle unit 120.

The deposition source nozzle unit 120, in one embodiment, is located at a side of the deposition source 110 facing the substrate 2. In this regard, the organic layer deposition assemblies according to the present embodiment each may include different deposition nozzles in performing deposition for forming common layers and pattern layers. In other words, although not shown in FIG. 3, a plurality of deposition source nozzles 121 may be arranged along the Y-axis direction, which is the direction in which the substrate 2 is scanned, at a deposition source nozzle unit for forming a pattern layer. Therefore, by forming the deposition source nozzles 121 such that the number of the deposition source nozzles 121 in the X-axis direction is only 1, formation of shadow may be reduced (e.g., significantly reduced). Alternatively, in other embodiments, a plurality of deposition source nozzles may be formed along the X-axis direction at a deposition source nozzle unit for forming a common layer. By doing so, a thickness uniformity of the common layer may be improved.

In one embodiment, the patterning slit sheet 130 may be located between the deposition source 110 and the substrate 2. The patterning slit sheet 130 may further include a frame having a shape similar to a window frame. The patterning slit sheet 130 includes a plurality of patterning slits 131 arranged along the X-axis direction. The deposition material 115 that has been vaporized in the deposition source 110 passes through the deposition source nozzle unit 120 and the patterning slit sheet 130 and is then deposited onto the substrate 2. In this regard, the patterning slit sheet 130 may be formed using the same method as that used to form an FMM, in particular, a stripe-type mask, e.g., etching. In this regard, a total number of patterning slits 131 may be more than a total number of deposition source nozzles 121.

In one embodiment, the deposition source 110 (and the deposition source nozzle unit 120 combined thereto) and the patterning slit sheet 130 may be spaced apart from each other by a certain distance (e.g., a gap).

As described above, deposition is performed while the organic layer deposition assembly 100-1 is moved relative to the substrate 2. In order for the organic layer deposition assembly 100-1 to be moved relative to the substrate 2, the patterning slit sheet 130 is spaced apart from the substrate 2 by a certain distance (e.g., a gap).

In a conventional deposition method using an FMM, deposition is typically performed with the FMM in close contact with a substrate in order to prevent formation of shadows on the substrate. However, when the FMM is formed in close contact with the substrate, defects due to the contact between the substrate and the FMM may occur. In addition, because it is difficult to move the mask with respect to the substrate, the mask and the substrate have the same size. Accordingly, the mask becomes larger as the size of a display device increases. However, it is difficult to form a large mask.

To address these problems, in the organic layer deposition assembly 100-1 according to the present embodiment, the patterning slit sheet 130 is formed spaced apart by a certain distance (e.g., a gap) from the substrate 2 on which a deposition material is to be deposited.

According to the present embodiment, deposition may be performed while a mask formed smaller than a substrate is moved with respect to the substrate, and thus, it is relatively easy to manufacture the mask. In addition, defects due to contact between the substrate and the mask may be prevented. In addition, because it is unnecessary to closely contact the substrate with the mask during a deposition process, a manufacturing speed may be improved.

Hereinafter, particular disposition of each element of the upper housing 104 will be described.

The deposition source 110 and the deposition source nozzle unit 120 are located at a bottom portion of the upper housing 104. Accommodation portions 104-1 are respectively formed on both sides of the deposition source 110 and the deposition source nozzle unit 120 to have a protruding shape. The first stage 150, the second stage 160, and the patterning slit sheet 130 are sequentially formed (or located) on the accommodation portions 104-1 in this order.

In this regard, the first stage 150 is formed to move in X-axis and Y-axis directions so that the first stage 150 aligns the patterning slit sheet 130 in the X-axis and Y-axis directions. That is, the first stage 150 includes a plurality of actuators so that the first stage 150 is moved in the X-axis and Y-axis directions with respect to the upper housing 104.

The second stage 160 is formed to move in a Z-axis direction so as to align the patterning slit sheet 130 in the Z-axis direction. That is, the second stage 160 includes a plurality of actuators and is formed to move in the Z-axis direction with respect to the first stage 150.

The patterning slit sheet 130 is located on the second stage 160. The patterning slit sheet 130 is located on the first stage 150 and the second stage 160 so as to move in the X-axis, Y-axis, and Z-axis directions, and thus, an alignment, in particular, a real-time alignment, between the substrate 2 and the patterning slit sheet 130, may be performed.

In addition, the upper housing 104, the first stage 150, and the second stage 160 may guide a flow path of the deposition material 115 such that the deposition material 115 discharged through the deposition source nozzles 121 is not dispersed outside the flow path. That is, the flow path of the deposition material 115 is sealed by the upper housing 104, the first stage 150, and the second stage 160, and thus, the movement of the deposition material 115 in the X-axis and Y-axis directions may be simultaneously guided thereby.

A shielding member 140 for preventing organic materials from being deposited on a non-layer forming region of the substrate 2 may further be arranged between the patterning slit sheet 130 and the deposition source 110. Although not shown in detail, the shielding member 140 may include two plates adjacent to each other. Because the non-layer forming region of the substrate 2 is covered by the shielding member 140, deposition of organic materials on the non-layer forming region of the substrate 2 may be reduced or prevented without a separate structure.

Hereinafter, the conveyer unit 400 that conveys (or transports) the substrate 2, on which the deposition material 115 is to be deposited, is described in detail. Referring to FIGS. 3 and 4, the conveyer unit 400 includes the first conveyer unit 410, the second conveyer unit 420, and the transfer unit 430.

The first conveyer unit 410 conveys (or transports) in an in-line manner the transfer unit 430, including the carrier 431 and an electrostatic chuck 432 attached thereto, and the substrate 2 attached to the transfer unit 430 so that an organic layer may be formed on the substrate 2 by the organic layer deposition assembly 100-1. The first conveyer unit 410 includes a coil 411, guide members 412, upper magnetically suspended bearings (e.g., magnetically levitating bearings or magnetic levitation bearings) (not shown), side magnetically suspended bearings (e.g., magnetically levitating bearings or magnetic levitation bearings) (not shown), and gap sensors (not shown). In one embodiment, the magnetically suspended bearings and the gap sensor are mounted on the guide members 412.

The second conveyer unit 420 returns to the loading unit 200 the transfer unit 430 from which the substrate 2 has been separated in the unloading unit 300 after one deposition cycle is completed while the transfer unit 430 is passing through the deposition unit 100. The second conveyer unit 420 includes a coil 421, roller guides 422, and a charging track 423.

The transfer unit 430 includes the carrier 431 that is conveyed (e.g., transported) along the first conveyer unit 410 and the second conveyer unit 420 and the electrostatic chuck 432 that is combined on (or attached to) a surface of the carrier 431. The substrate 2 is attached to the electrostatic chuck 432.

Hereinafter, each element of the conveyer unit 400 will be described in more detail.

The carrier 431 of the transfer unit 430 will now be described in detail.

The carrier 431 includes a main body part 431a, a magnetic rail (e.g., a linear motor system (LMS) magnet) 431b, contactless power supply (CPS) modules 431c, a power supply unit 431d, and guide grooves 431e.

The main body part 431a constitutes a base part of the carrier 431 and may be formed of a magnetic material such as iron. In this regard, due to a respective repulsive force and/or an attractive force between the main body part 431a and the respective upper and side magnetically suspended bearings (e.g., magnetic levitation bearings), which are described below, the carrier 431 may be maintained spaced apart from the guide members 412 by a certain distance (e.g., a gap).

The guide grooves 431e may be respectively formed at both sides of the main body part 431a and each may accommodate a guide protrusion 412e of the guide member 412.

The magnetic rail 431b may be formed along a center line of the main body part 431a in a direction where the main body part 431a proceeds. The LMS magnet 431b and the coil 411, which are described below, may be combined with each other to constitute a linear motor, and the carrier 431 may be conveyed in an arrow A direction by the linear motor.

The CPS modules 431c and the power supply unit 431d may be respectively formed on both sides of the LMS magnet 431b in the main body part 431a. The power supply unit 431d includes a battery (e.g., a rechargeable battery) that provides power so that the electrostatic chuck 432 can chuck (e.g., fix or hold) the substrate 2 and maintains operation. The CPS modules 431c are a wireless charging module that charges the power supply unit 431d. For example, the charging track 423 formed in the second conveyer unit 420, which is described below, is connected to an inverter (not shown), and thus, when the carrier 431 is transferred into the second conveyer unit 420, a magnetic field is formed between the charging track 423 and the CPS modules 431c so as to supply power to the CPS module 431c. The power supplied to the CPS modules 431c is used to charge the power supply unit 431d.

The electrostatic chuck 432 may include an electrode embedded in a main body formed of ceramic, wherein the electrode is supplied with power. The substrate 2 is attached onto a surface of the main body of the electrostatic chuck 432 as a suitable voltage or a relatively high voltage (e.g., a high voltage) is applied to the electrode.

Next, an operation of the transfer unit 430 will be described in detail.

The magnetic rail 431b of the main body unit 431a may be combined with the coils 411 and constitute a driving unit. Here, the driving unit may be a linear motor. Compared to a slide guiding system, a linear motor is a device with precise or highly precise position determination due to a relatively small friction coefficient and little positioning errors. As described above, a linear motor may include the coils 411 and the magnetic rail 431b, wherein the magnetic rail 431b may be linearly arranged in the carrier 431, and the plurality of coils 411 may be arranged at a region in the chamber 101 to face the magnetic rail 431b. As described above, the magnetic rail 431b is arranged on the carrier 431, which is a moving object, instead of the coils 411, and thus the carrier 431 may be driven without applying power to the carrier 431. Here, the coils 411 are formed in an atmosphere (ATM) box and are installed in an atmosphere, whereas the magnetic rail 431b is attached to the carrier 431, such that the carrier 431 may move in the vacuum chamber 101.

Hereinafter, the first conveyer unit 410 and the transfer unit 430 are described in detail.

Referring to FIG. 4, the first conveyer unit 410 conveys (e.g., transports) the electrostatic chuck 432 that fixes the substrate 2 and the carrier 431 that conveys (e.g., transports) the electrostatic chuck 432. In this regard, the first conveyer unit 410 includes the coil 411, the guide members 412, the upper magnetically suspended bearings (e.g., the upper magnetic levitation bearings), the side magnetically suspended bearings (e.g., the side magnetic levitation bearings), and the gap sensors.

The coil 411 and the guide members 412 are formed (or located) inside the upper housing 104. The coil 411 is formed (or located) in an upper portion of the upper housing 104, and the guide members 421 are respectively formed on both inner sides of the upper housing 104.

The guide members 412 guide the carrier 431 to move in a direction. In this regard, the guide members 412 are formed to pass through the deposition unit 100.

The side magnetically suspended bearings (e.g., the side magnetic levitation bearings) are each located at the guide member 412 so as to respectively correspond to both sides of the carrier 431. The side magnetically suspended bearings (e.g., the side magnetic levitation bearings) cause a distance between the carrier 431 and the guide member 412 so that the carrier 431 is moved along the guide members 412 in non-contact with the guide members 412. That is, a repulsive force occurring between the side magnetically suspended bearing (e.g., the side magnetic levitation bearing) on the left side and the carrier 431, which is a magnetic material, and a repulsive force occurring between the side magnetically suspended bearing (e.g., the side magnetic levitation bearing) on the right side and the carrier 431, maintain equilibrium or substantial equilibrium, and thus, there is a constant distance (e.g., a substantially constant gap) between the carrier 431 and the respective guide members 412.

Each upper magnetically suspended bearing (e.g., upper magnetic levitation bearing) may be located at the guide member 412 so as to be above the carrier 431. The upper magnetically suspended bearings (e.g., the upper magnetic levitation bearings) enable the carrier 431 to be moved along the guide members 412 in non-contact with the first and second accommodation parts 412a and 412b of the guide members 412 and with a distance (e.g., a gap) therebetween maintained constantly (or substantially constantly). That is, an attractive force occurring between the upper magnetically suspended bearing (e.g., the upper magnetic levitation bearing) and the carrier 431, which is a magnetic material, and gravity, maintain equilibrium or substantial equilibrium, and thus, there is a constant distance or a substantially constant distance between the carrier 431 and the respective guide members 412.

Each guide member 412 may further include the gap sensor. The gap sensor may measure a distance between the carrier 431 and the guide member 412. Furthermore, the gap sensor may be disposed at a side of the side magnetically suspended bearing (e.g., the side magnetic levitation bearing). The gap sensor may measure a distance between a side surface of the carrier 431 and the side magnetically suspended bearing (e.g., the side magnetic levitation bearing).

Magnetic forces of the upper and side magnetically suspended bearings (e.g., magnetic levitation bearings) may vary according to values measured by the gap sensors, and thus, distances between the carrier 431 and the respective guide members 412 may be adjusted in real time. That is, a precise transfer of the carrier 431 may be feedback controlled using the upper and side magnetically suspended bearings (e.g., magnetic levitation bearings) and the gap sensors.

Hereinafter, the second conveyer unit 420 and the transfer unit 430 are described in detail.

Referring back to FIG. 4, the second conveyer unit 420 returns the electrostatic chuck 432 from which the substrate 2 has been separated in the unloading unit 300 and the carrier 431 that carries the electrostatic chuck 432 to the loading unit 200. In this regard, the second conveyer unit 420 includes the coil 421, the roller guides 422, and the charging track 423.

For example, the coil 421, the roller guides 422, and the charging track 423 may be positioned inside the lower housing 103. The coil 421 and the charging track 423 may be located at a top inner surface of the lower housing 103, and the roller guides 422 may be located at both inner sides of the lower housing 103. The coil 421 may be located in an ATM box, similar to the coil 411 of the first conveyer unit 410.

Similar to the first conveyer unit 410, the second conveyer unit 410 may also include the coil 421. Also, the magnetic rail (e.g., the LMS magnet) 431b of the main body part 431a of the carrier 431 and the coil 421 are combined with each other to constitute an operation unit. In this regard, the operation unit may be a linear motor. The carrier 431 may be moved by the linear motor along a direction opposite to the direction of arrow A illustrated in FIG. 3.

The roller guides 422 guide the carrier 431 to move in a direction. In this regard, the roller guides 422 are formed to pass through the deposition unit 100.

The second conveyer unit 420 is used in a process of returning the carrier 431 from which the substrate 2 has been separated and not in a process of depositing an organic material on the substrate 2, and thus, position accuracy (or positional accuracy) thereof is not needed as by the first conveyer unit 410. Therefore, magnetic suspension is applied to the first conveyer unit 410 that requires high position accuracy, thereby obtaining position accuracy, and a conventional roller method is applied to the second conveyer unit 420 that requires relatively low position accuracy, thereby reducing manufacturing costs and simplifying a structure of the thin-film deposition apparatus. Although not illustrated in FIG. 4, the magnetic suspension (e.g., magnetic levitation) may also be applied to the second conveyer unit 420 as in the first conveyer unit 410.

The organic layer deposition assemblies 100-1 of the apparatus for organic material deposition (e.g., a thin film deposition apparatus or an organic layer deposition apparatus) 1 according to an embodiment of the present invention may include cameras 170 and sensors 180 for alignment. For example, the cameras 170 may align a first mark (not shown) formed on the frame of the patterning slit sheet 130 and a second mark (not shown) formed on the substrate 2 in real-time. The sensors 180 may be confocal sensors. As described above, because a distance between the substrate 2 and the patterning slit sheet 130 is measurable in real time using the cameras 170 and the sensors 180, the substrate 2 may be aligned with the patterning slit sheet 130 in real time, whereby position accuracy of a pattern may be improved (e.g., significantly improved).

A thin film, such as an organic layer of an organic light emitting display apparatus, may be formed by using the thin film deposition apparatus (e.g., the organic layer deposition apparatus). Detailed descriptions thereof will be given below.

Figure 5:
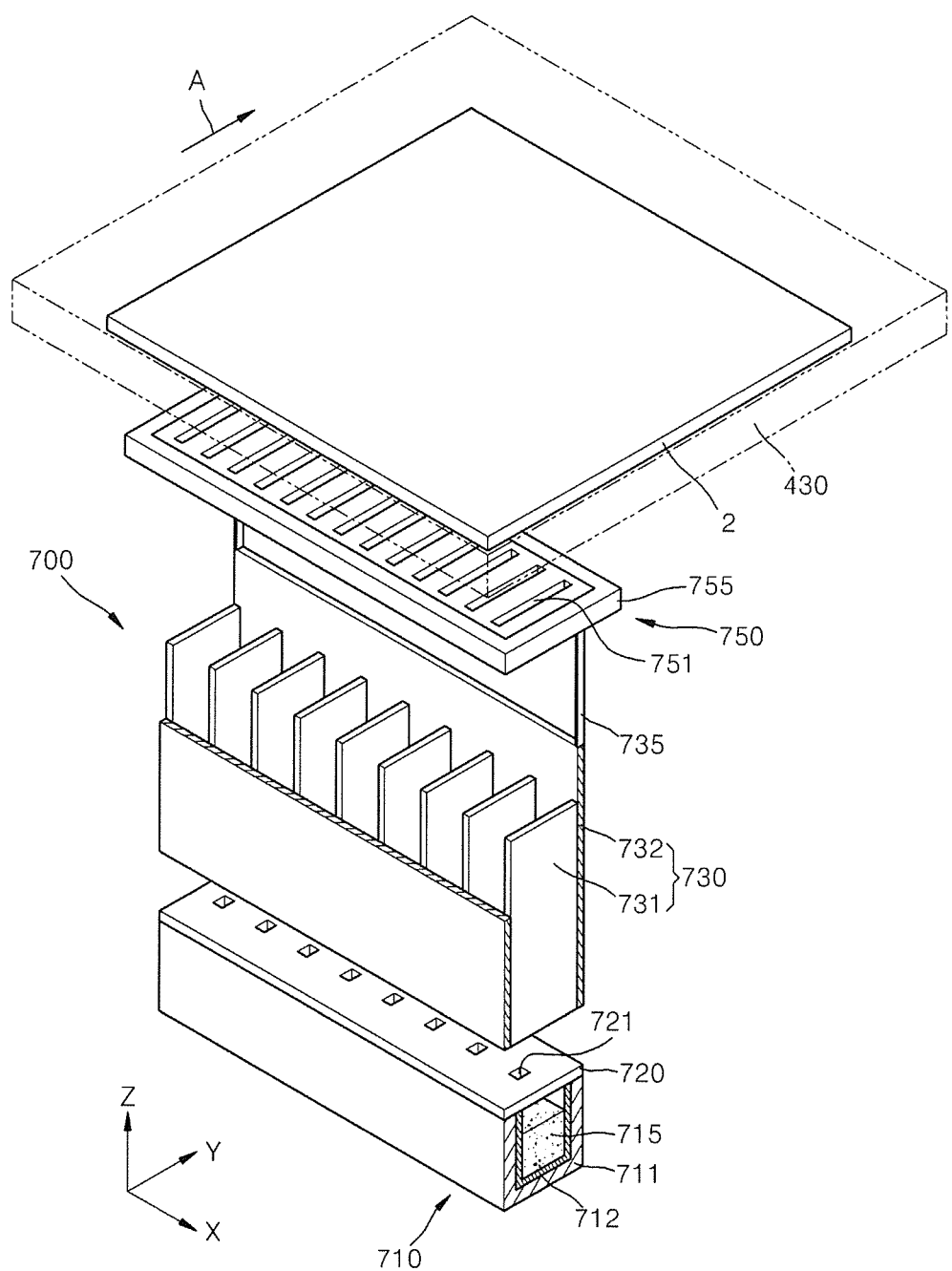
FIG. 5 is a schematic perspective view of an organic layer deposition assembly according to another embodiment of the present invention.
Figure 6:
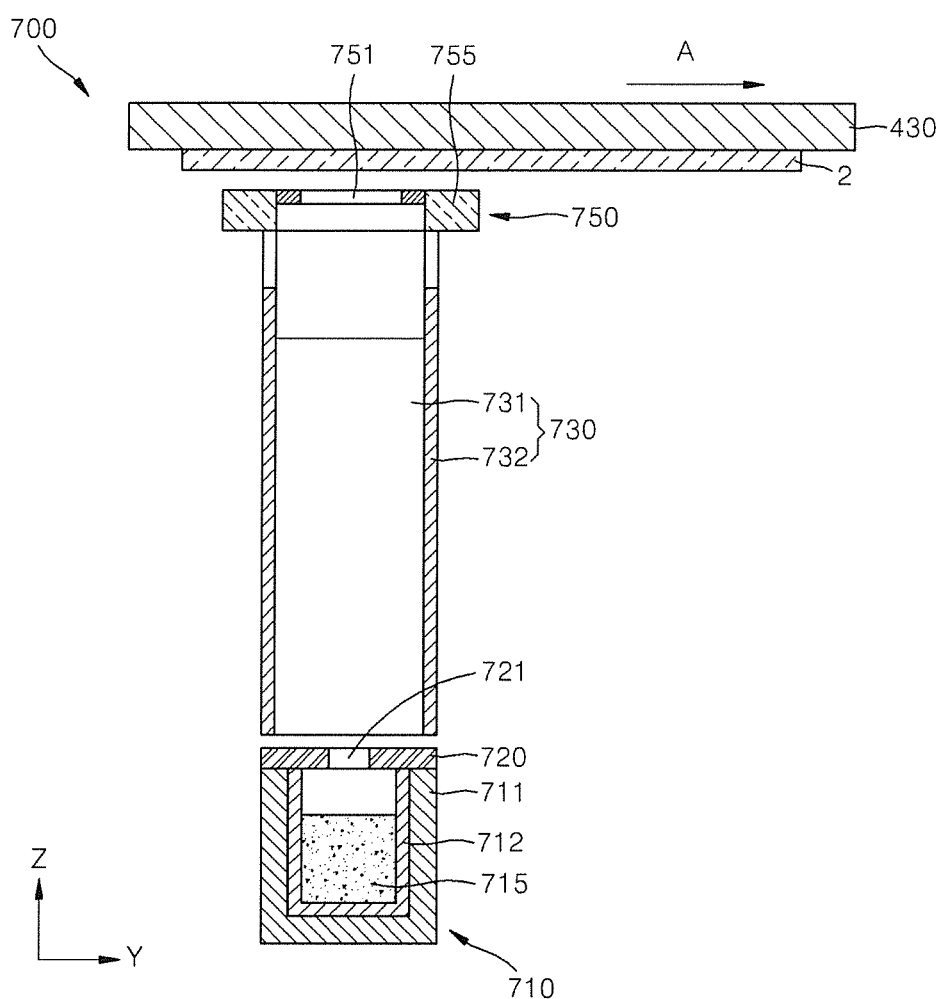
FIG. 6 is a schematic sectional view of the organic layer deposition assembly of FIG. 5.
Figure 7:
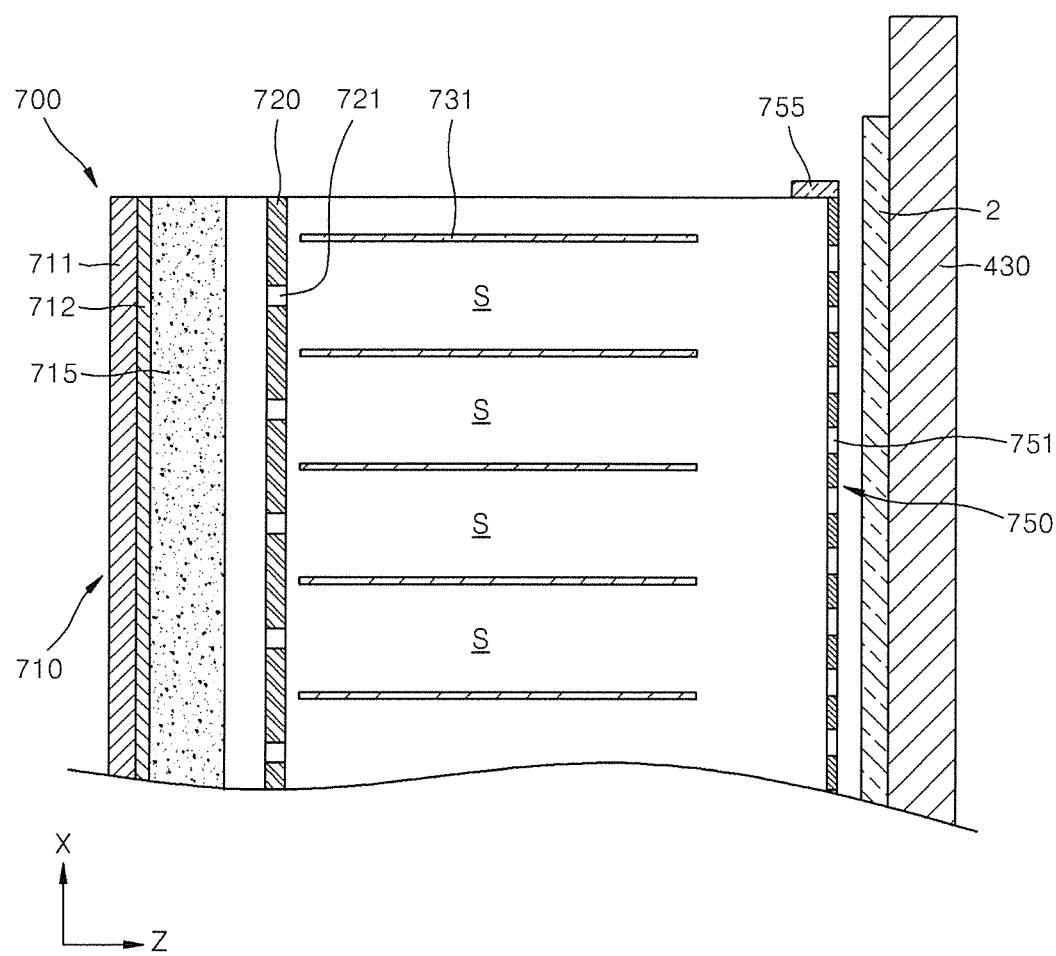
FIG. 7 is a schematic plan view of the organic layer deposition assembly of FIG. 5.

FIG. 5 is a schematic perspective view of an organic layer deposition assembly 700 according to another embodiment of the present invention, FIG. 6 is a schematic sectional view of the organic layer deposition assembly 700 of FIG. 5, and FIG. 7 is a schematic plan view of the organic layer deposition assembly 700 of FIG. 5.

Referring to FIGS. 5 through 7, the organic layer deposition assembly 700 includes a deposition source 710, a deposition source nozzle unit 720, a shielding plate assembly (e.g., a barrier assembly or a barrier plate assembly) 730, and a patterning slit sheet 750.

Here, the deposition source 710 includes a crucible 711 filled with a deposition material 715 and a heater 712 for evaporating the deposition material 715 that is filled in the crucible 711 toward the deposition source nozzle unit 720 by heating the crucible 711. The deposition source nozzle unit 720 is arranged at one side of the deposition source 710, wherein a plurality of deposition source nozzles 721 are arranged along the X-axis direction at the deposition source nozzle unit 720.

The shielding plate assembly 730 is arranged at one side of the deposition source nozzle unit 720. The shielding plate assembly 730 includes a plurality of shielding plates 731 and a shielding plate frame 732 arranged outside (e.g., around or surrounding) the shielding plates 731. The plurality of shielding plates 731 may be arranged next to one another along the X-axis direction. Here, the shielding plates 731 may be formed at a constant or substantially constant interval. Furthermore, each of the shielding plates 731 extends on the Y-Z plane and may have a rectangular shape. The plurality of shielding plates 731 arranged as described above define or partition the space between the deposition source nozzle unit 720 and the patterning slit sheet 750 into a plurality of deposition spaces S. In other words, in the organic layer deposition assembly 700 according to the present embodiment, the deposition spaces S are defined or partitioned by the shielding plates 731 with respect to the respective deposition source nozzles 721 which emit deposition materials, as shown in FIG. 5. As described above, by defining or partitioning the space between the deposition source nozzle unit 720 and the patterning slit sheet 750 into the plurality of deposition spaces S, a deposition material emitted by a deposition source nozzle 721 passes through the respective patterning slits 751 and is deposited onto the substrate 2 without being mixed with deposition materials emitted by the other deposition source nozzles 721. In other words, the shielding plates 731 guide paths in which deposition materials move, such that the deposition materials emitted by the respective deposition source nozzles 721 move straight or substantially straight in the Z-axis direction without being dispersed.

As described above, by securing straight-going property of deposition materials by arranging the shielding plates 731, the size of a shadow formed on a substrate may be reduced (e.g., significantly reduced), and thus the organic layer deposition assembly 700 and the substrate 2 may be spaced apart (e.g., by a predetermined distance) from each other.

The patterning slit sheet 750 is further arranged between the deposition source 710 and the substrate 2. The patterning slit sheet 750 includes a frame 755 which is formed in a window frame-like shape, wherein a plurality of patterning slits 751 are formed in (e.g., arranged along) the patterning slit sheet 750 in the X-axis direction. The evaporated deposition material 715 in the deposition source 710 passes through the deposition source nozzle unit 720 and the patterning slit sheet 750 and moves toward the substrate 2, which is the target object.

Figure 8:
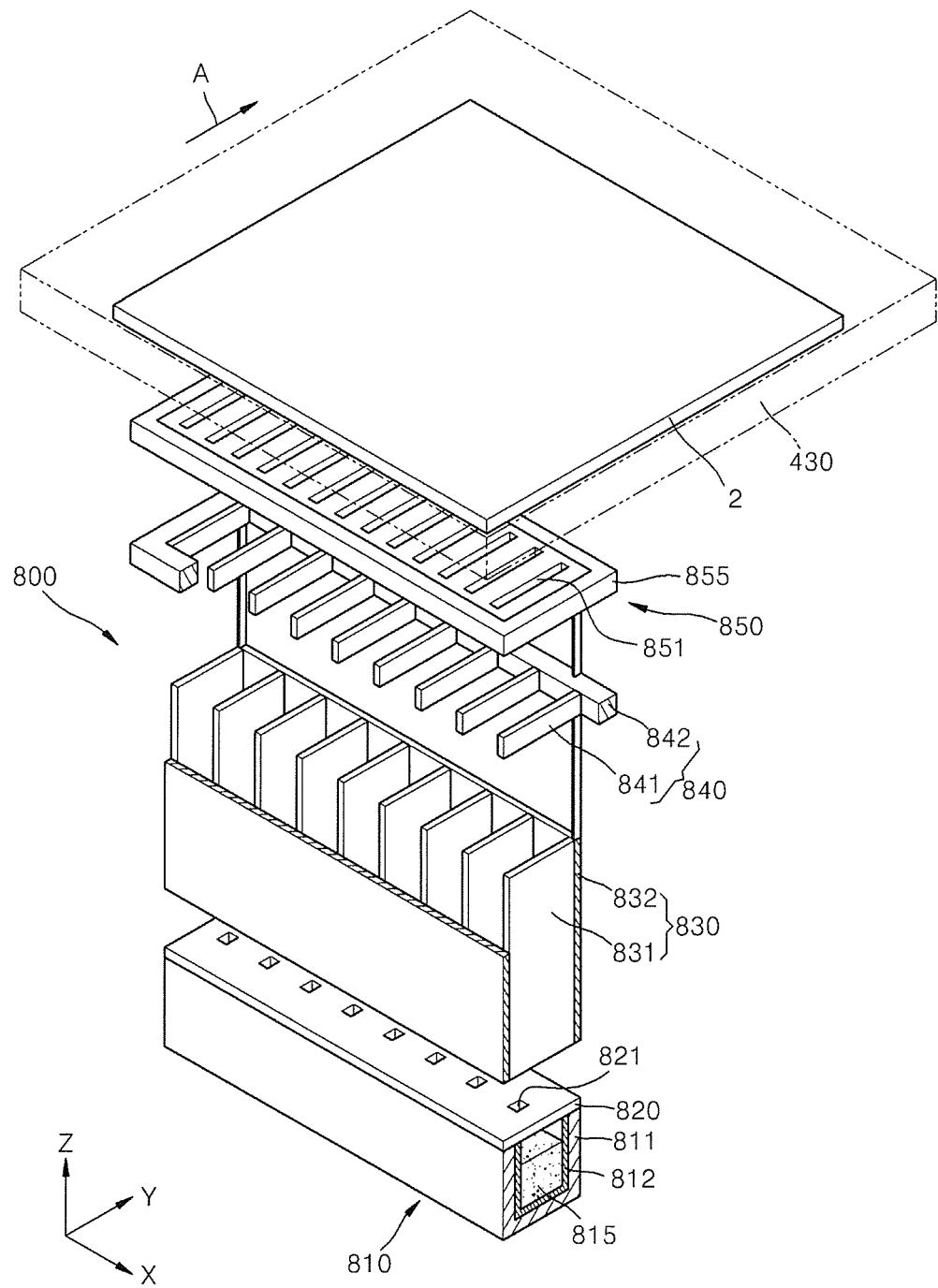
FIG. 8 is a schematic perspective view of an organic layer deposition assembly according to another embodiment of the present invention.

FIG. 8 is a schematic perspective view of an organic layer deposition assembly 800 according to another embodiment of the present invention.

The organic layer deposition assembly 800 according to the embodiment shown in FIG. 8 includes a deposition source 810, a deposition source nozzle unit 820, a first shielding plate assembly (e.g., a first barrier plate assembly)

830, a second shielding plate assembly (e.g., a second barrier plate assembly) 840, and a patterning slit sheet 850. Here, the deposition source 810, the first shielding plate assembly 830, and the patterning slit sheet 850 are identical or substantially identical to those according to the embodiment shown in FIG. 5, and thus detailed descriptions thereof is omitted. The present embodiment differs from the previous embodiment in that the second shielding plate assembly 840 is located at one side of the first shielding plate assembly 830.

For example, the second shielding plate assembly 840 includes a plurality of second shielding plates (e.g., barrier plates) 841 and a second shielding plate frame 842 arranged outside (e.g., around or surrounding) the second shielding plates 841. The plurality of second shielding plates 841 may be arranged next to one another along the X-axis direction. Furthermore, the plurality of second shielding plates 841 may be formed at a constant or substantially constant interval. Furthermore, each of the second shielding plates 841 is formed to be parallel to the Y-Z plane, that is, perpendicular to the X-axis direction. The patterning slit sheet 850 includes a plurality of patterning slits 851 arranged along the X-direction.

The plurality of first shielding plates 831 and the plurality of second shielding plates 841 arranged as described above define or partition the space between the deposition source nozzle unit 820 and the patterning slit sheet 850. In other words, deposition spaces are defined by the first shielding plates 831 and the second shielding plates 841 for the respective deposition source nozzles 821 which jet (e.g., emit or discharge) deposition materials.

Here, the second shielding plates 841 may be arranged in correspondence to the first shielding plates 831, respectively. In other words, the second shielding plates 841 may be aligned with the first shielding plates 831, respectively. In other words, the first shielding plate 831 and the second shielding plate 841 corresponding to each other are arranged on same respective planes. Although it is shown that the thickness of the first shielding plate 831 is identical or substantially identical to the thickness of the second shielding plate 841 along the X-axis direction, the present invention is not limited thereto. In other words, the second shielding plates 841, which need to be precisely aligned with patterning slits 851, may be formed to have relatively small thickness, whereas the first shielding plates 831, which do not need to be precisely aligned, may be formed to have relatively large thickness for ease of manufacturing.

Figure 9:
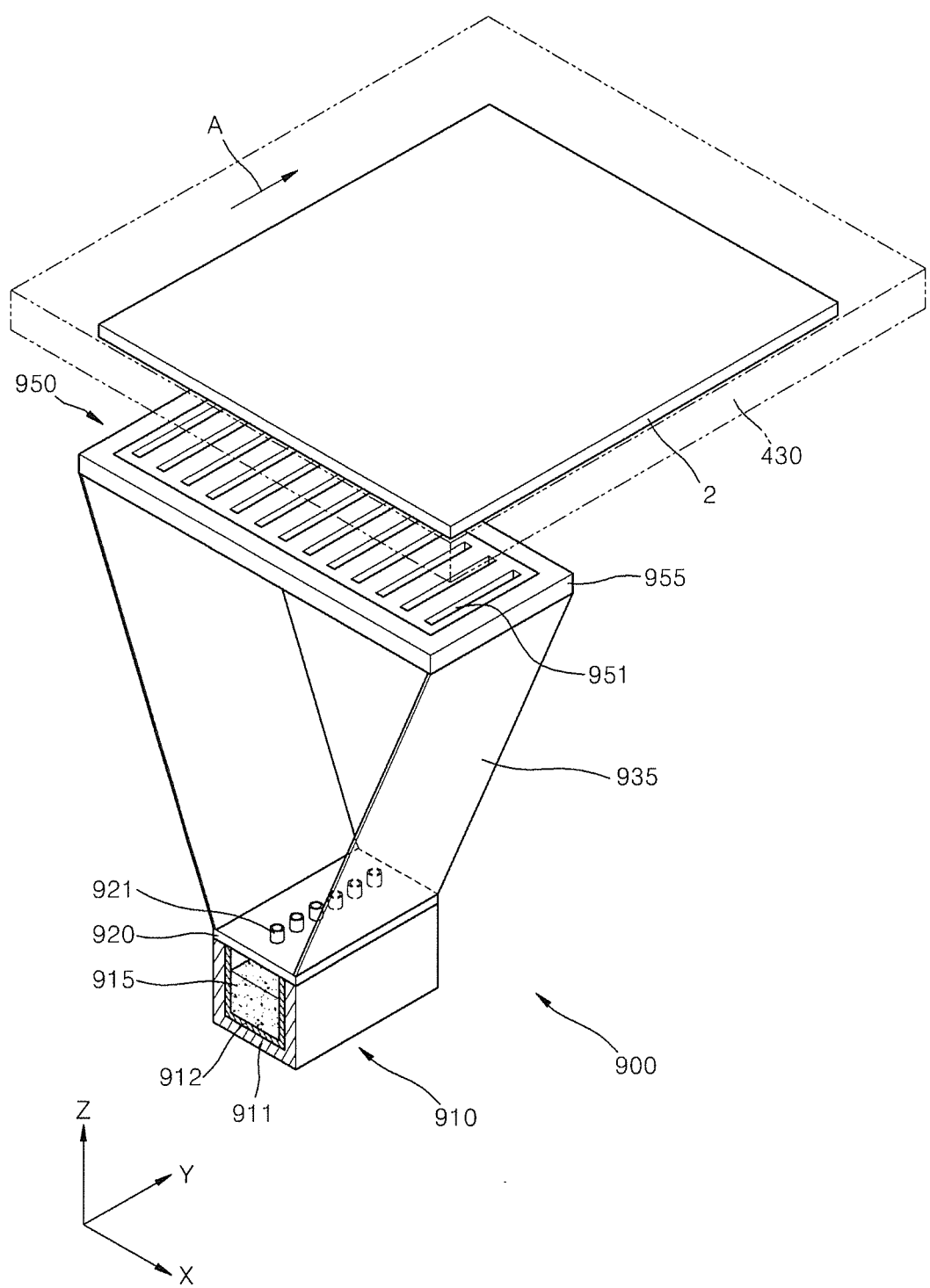
FIG. 9 is a schematic perspective view of an organic layer deposition assembly according to another embodiment of the present invention.

FIG. 9 is a schematic perspective view of an organic layer deposition assembly 900 according to another embodiment of the present invention.

Referring to FIG. 9, the organic layer deposition assembly 900 according to the present embodiment includes a deposition source 910, a deposition source nozzle unit 920, and a patterning slit sheet 950.

Here, the deposition source 910 includes a crucible 911 filled with a deposition material 915 and a heater 912 for evaporating the deposition material 915 that is filled in the crucible 911 toward the deposition source nozzle unit 920 by heating the crucible 911. The deposition source nozzle unit 920 is arranged at one side of the deposition source 910, wherein a plurality of deposition source nozzles 921 are formed along the Y-axis direction at the deposition source nozzle unit 920.

The patterning slit sheet 950 and a frame 955 are further arranged between the deposition source 910 and the substrate 2, and a plurality of patterning slits 951 are formed at the patterning slit sheet 950 along the X-axis direction.

Furthermore, the deposition source 910, the deposition source nozzle unit 920, and the patterning slit sheet 950 are combined with one another via a connecting member (or connecting members) 935.

The present embodiment differs from the previous embodiments in the arrangement of the deposition source nozzles 921 arranged at the deposition source nozzle unit 920. Detailed description thereof is given below.

The deposition source nozzle unit 920 is arranged at one side of the deposition source 910, and more particularly, the side of the deposition source 910 facing the substrate 2. Furthermore, the plurality of deposition source nozzles 921 are formed at the deposition source nozzle unit 920 along the Y-axis direction (that is, the direction in which the substrate 2 is scanned or moved). Here, the plurality of deposition source nozzles 921 may be formed at a constant or substantially constant interval. An evaporated deposition material 915 in the deposition source 910 passes through the deposition source nozzles 921 of the deposition source nozzle unit 920 and moves toward the substrate 2, which is the target object. As a result, the plurality of deposition source nozzles 921 are formed in a single organic layer deposition assembly 900 along the direction in which the substrate 2 is scanned. In this case, if the plurality of deposition source nozzles 921 were arranged along the X-axis direction, distances between the respective deposition source nozzles 921 and a patterning slit 951 would differ, and a shadow may be formed by the deposition material 915 emitted by the deposition source nozzle 921 that is the farthest away from the patterning slit 951. Therefore, formation of a shadow may be reduced (or significantly reduced) by forming the deposition source nozzles 921, such that only one deposition source nozzle 921 is arranged along the X-axis direction. Furthermore, because the plurality of deposition source nozzles 921 are arranged along the scanning direction, even if fluxes of the respective deposition source nozzles 921 differ, the differences may be offset and deposition uniformity may be maintained constantly or substantially constantly.

Hereinafter, a structure of an organic layer formed using the thin-film deposition apparatus 1 described above is described in detail.

Figure 10:
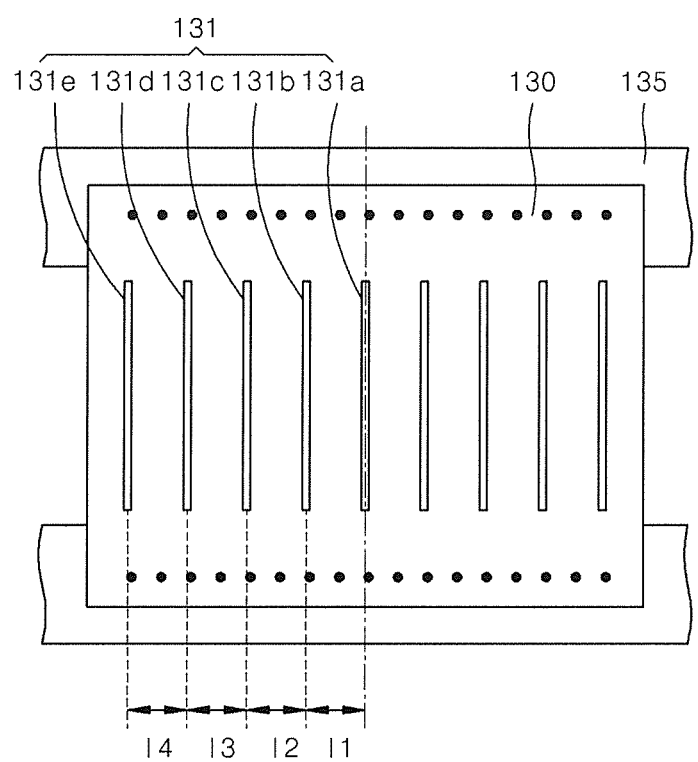
FIG. 10 is a diagram illustrating a structure in which patterning slits are arranged at equal intervals in a patterning slit sheet of the thin-film deposition apparatus of FIG. 3.
Figure 11:
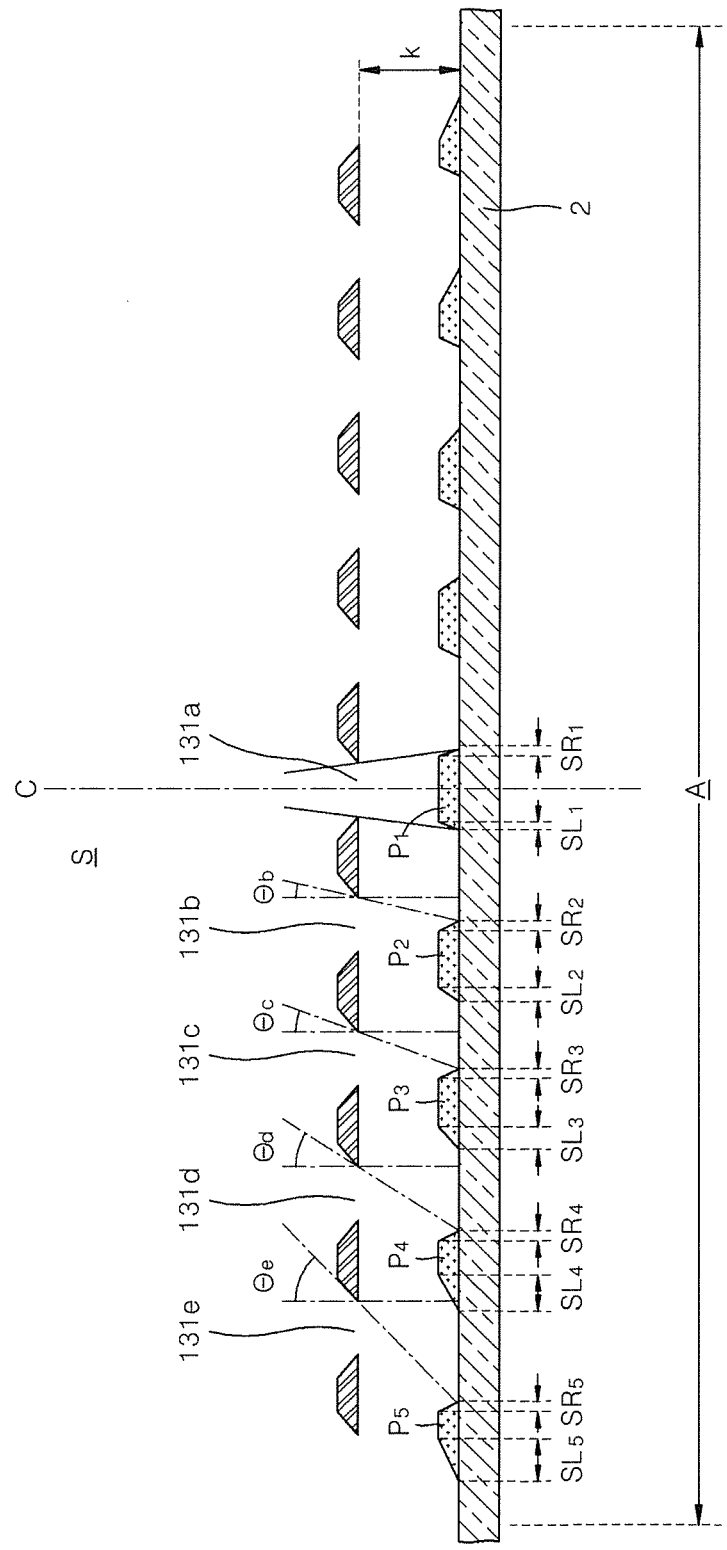
FIG. 11 is a diagram illustrating organic layers formed on a substrate by using the patterning slit sheet of FIG. 10, according to an embodiment of the present invention.

FIG. 10 is a diagram illustrating a structure in which the patterning slits 131 are arranged at equal intervals in the patterning slit sheet 130 of the thin-film deposition apparatus 1 including the deposition unit 100 of FIG. 3, according to an embodiment of the present invention. FIG. 11 is a diagram illustrating organic layers formed on the substrate 2 by using the patterning slit sheet 130 of FIG. 10, according to an embodiment of the present invention.

FIGS. 10 and 11 schematically illustrate the patterning slit sheet 130 in which the patterning slits 131 are arranged at equal intervals. That is, in FIG. 10, the patterning slits 131 satisfy the following condition: $I_1=I_2=I_3=I_4$.

In this embodiment, an incident angle of a deposition material discharged along a center line C of a deposition space S is substantially perpendicular to the substrate 2. Thus, an organic layer $P_1$ formed using the deposition material that has passed through a patterning slit 131$a$ has a minimum (or reduced) size of a shadow, and a right-side shadow $SR_1$ and a left-side shadow $SL_1$ are formed symmetrical to (or symmetrically with) each other.

However, a critical incident angle θ of the deposition material that passes through patterning slits located farther from the center line C of the deposition space S gradually increases, and thus, in one embodiment, the critical incident angle θ of the deposition material that passes through the outermost patterning slit 131e is approximately 55°. Accordingly, the deposition material is incident at an inclination with respect to the patterning slit 131e, and an organic layer $P_5$ formed using the deposition material that has passed through the patterning slit 131e has the largest shadow. For example, a left-side shadow $SL_5$ is larger than a right-side shadow $SR_5$.

That is, as the critical incident angle θ of the deposition material increases, the size of the shadow also increases. For example, the size of the shadow at a position farther from the center line C of the deposition space S increases. In addition, the critical incident angle θ of the deposition material increases as a distance between the center line C of the deposition space S and the respective patterning slits increases. Thus, organic layers formed using the deposition material that passes through the patterning slits located farther from the center line C of the deposition space S have a relatively larger shadow size. For example, of the shadows on both sides of the respective organic layers, the size of the shadow at a position farther from the center line C of the deposition space S is larger than that of the other.

That is, referring to FIG. 11, the organic layers formed on the left side of the center line C of the deposition space S have a structure in which a left hypotenuse (e.g., a slanted side on the left between top and bottom sides) is larger than a right hypotenuse (e.g., a slanted side on the right between the top and bottom sides), and the organic layers formed on the right side of the center line C of the deposition space S have a structure in which a right hypotenuse (e.g., a right slanted side) is larger than a left hypotenuse (e.g., a left slanted side).

In addition, in the organic layers formed on the left side of the center line C of the deposition space S, the length of the left hypotenuse (e.g., the left slanted side) increases towards the left. In the organic layers formed on the right side of the center line C of the deposition space S, the length of the right hypotenuse (e.g., the right slanted side) increases towards the right. Consequently, the organic layers formed in the deposition space S may be formed symmetrical to each other about the center line C of the deposition space S.

This structure will now be described in further detail.

The deposition material that passes through a patterning slit 131b passes through the patterning slit 131b at a critical incident angle of $\theta_b$, and an organic layer $P_2$ formed using the deposition material that has passed through the patterning slit 131b has a left-side shadow having a size of $SL_2$. Similarly, the deposition material that passes through a patterning slit 131c passes through the patterning slit 131c at a critical incident angle of $\theta_c$, and an organic layer $P_3$ formed using the deposition material that has passed through the patterning slit 131c has a left-side shadow having a size of $SL_3$. Similarly, the deposition material that passes through a patterning slit 131d passes through the patterning slit 131d at a critical incident angle of $\theta_d$, and an organic layer $P_4$ formed using the deposition material that has passed through the patterning slit 131d has a left-side shadow having a size of $SL_4$. Similarly, the deposition material that passes through the patterning slit 131e passes through the patterning slit 131e at a critical incident angle of $\theta_e$, and an organic layer $P_5$ formed using the deposition material that has passed through the patterning slit 131e has a left-side shadow having a size of $SL_5$.

In this regard, the critical incident angles satisfy the following condition: $\theta_b < \theta_c < \theta_d < \theta_e$, and thus, the sizes of the shadows of the organic layers also satisfy the following condition: $SL_1 < SL_2 < SL_3 < SL_4 < SL_5$.

Figure 12:
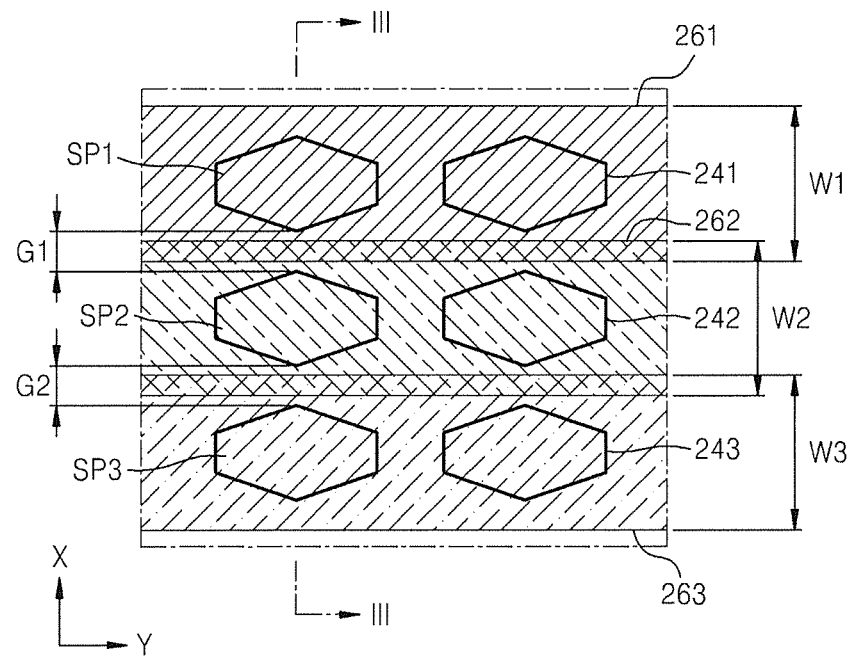
FIG. 12 is a plan view of an organic light emitting display apparatus according to an embodiment of the present invention, which is manufactured by using a thin-film deposition apparatus as described above.
Figure 13:
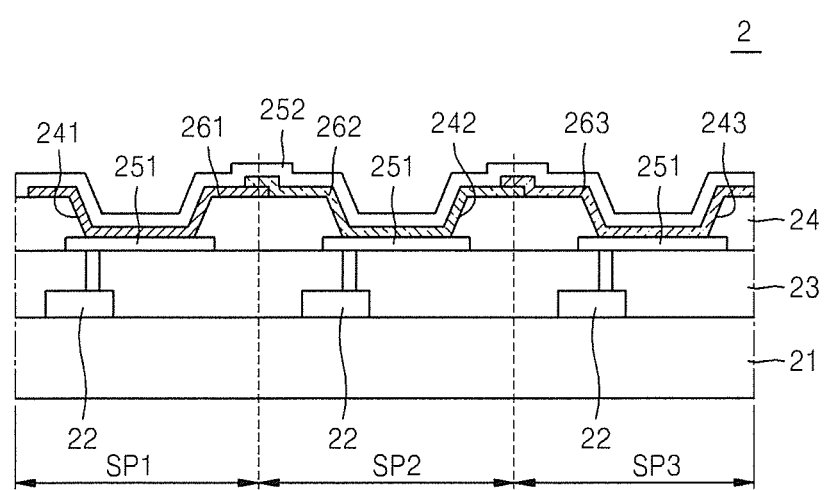
FIG. 13 is a cross-sectional view obtained along the line III-III of FIG. 12.

FIG. 12 is a plan view of an organic light emitting display apparatus according to an embodiment of the present invention, which is manufactured by using a thin-film deposition apparatus as described above according to one or more suitable embodiments of the present invention. FIG. 13 is a cross-sectional view obtained along the line III-III of FIG. 12. In FIG. 12, for convenience of explanation, two each of first through third sub-pixels SP1, SP2, and SP3 from among a plurality of pixels are shown.

Referring to FIGS. 12 and 13, an organic light emitting display apparatus is formed on a bottom substrate 21. The bottom substrate 21 may be formed of a glass material, a plastic material, a metal, or any other suitable material that is known to one of ordinary skill in the art.

A plurality of pixels are formed on the bottom substrate 21, where each of the pixels may include a plurality of sub-pixels SP1, SP2, and SP3 which emit different colors from one another. According to an embodiment of the present invention as shown in FIGS. 12 and 13, each pixel P includes a first sub-pixel SP1, a second sub-pixel SP2, and a third sub-pixel SP3. The first sub-pixel SP1, the second sub-pixel SP2, and the third sub-pixel SP3 may be sub-pixels for emitting red light, green light, and blue light, respectively. However, the present invention is not limited thereto, and the first sub-pixel SP1, the second sub-pixel SP2, and the third sub-pixel SP3 may be used to emit any of various color combinations of light for representing white color.

As shown in FIG. 13, a driving circuit 22 is arranged at each sub-pixel. Each driving circuit 22 may include at least one TFT (not shown) and at least one capacitor (not shown).

A first insulation layer 23 covers the driving circuits 22. A plurality of pixel electrodes 251 that are electrically connected to the respective driving circuit 22 are formed on the first insulation layer 23. Each of the pixel electrodes 251 is independently located (e.g., separated or spaced from each other) in correspondence to each of the sub-pixels.

A second insulation layer 24 is formed on the first insulation layer 23. The second insulation layer 24 is formed to cover the pixel electrodes 251 and defines a light-emitting region by partially exposing the pixel electrodes 251 by forming first through third openings.

The first openings, the second openings, and the third openings may be located in correspondence to the first sub-pixel SP1, the second sub-pixel SP2, and the third sub-pixel SP3, respectively. Meanwhile, the first openings define first light-emitting regions 241, the second openings define second light-emitting regions 242, and the third openings define third light-emitting regions 243.

A plurality of first lines 261, a plurality of second lines 262, and a plurality of third lines 263 are formed on the second insulation layer 24 to cover the first light-emitting regions 241, the second light-emitting regions 242, and the third light-emitting regions 243, respectively.

In one embodiment, the first lines 261 include a first organic light-emitting layer, e.g., a red organic light-emitting layer.

In one embodiment, the second lines 262 include a second organic light-emitting layer, e.g., a green organic light-emitting layer.

In one embodiment, the third lines 263 include a third organic light-emitting layer, e.g., a blue organic light-emitting layer.

Next, a counter electrode 252 is formed to cover the first lines 261, the second lines 262, and the third lines 263. The counter electrode 252 may be a common electrode formed to be common to all of the pixels P.

The pixel electrodes 251 may be formed as a transparent electrode or a reflective electrode. Such a transparent electrode may be formed of indium tin oxide (ITO), indium zinc oxide (IZO), zinc oxide (ZnO), or indium oxide ($In_2O_3$). Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) and/or a compound thereof, and forming a layer of ITO, IZO, ZnO, or $In_2O_3$ on the reflective layer. The pixel electrodes 251 may be formed by forming a layer by, for example, sputtering, and then patterning the layer by, for example, photolithography.

The counter electrode 252 may also be formed as a transparent electrode or a reflective electrode. When the counter electrode 252 is formed as a transparent electrode, the counter electrode 252 is used as a cathode. To this end, such a transparent electrode may be formed by forming a thin-film using a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), and/or a compound thereof and forming an auxiliary electrode layer or a bus electrode line thereon from ITO, IZO, ZnO, $In_2O_3$, or the like. When the second electrode 62 is formed as a reflective electrode, the reflective layer may be formed by thickly depositing Li, Ca, LiF/Ca, LiF/Al, Al, Ag, Mg, and/or a compound thereof on the entire surface of the organic layer 63. The counter electrode 252 may be formed using any suitable organic layer deposition apparatus described above according to embodiments of the present invention.

Functional organic layers other than the first lines 261, the second lines 262, and the third lines 263 may be further arranged between the pixel electrodes 251 and the counter electrode 252.

The functional organic layers may be single layers or composite layers in which a hole injection layer (HIL), a hole transport layer (HTL), an electron transport layer (ETL), and an electron injection layer (EIL) are stacked.

The first lines 261, the second lines 262, and the third lines 263 are successively deposited by using the organic layer deposition apparatus as described above.

In other words, as shown in FIG. 13, as the bottom substrate 21a, on which the second insulation layer 24 including the first light-emitting regions 241, the second light-emitting regions 242, and the third light-emitting regions 243, is formed, passes through the deposition unit 100 at which the plurality of organic layer deposition assemblies 100-1 through 100-n are arranged, organic layers including the first lines 261, the second lines 262, the third lines 263, and functional organic layers are formed.

Because formations of the organic layers are successively performed along the direction indicated by the arrow A in FIG. 3, the first lines 261, the second lines 262, and the third lines 263 extend in a first direction Y, which is parallel to the direction indicated by the arrow A in FIG. 3, as shown in FIG. 12.

Here, from among the first lines 261, the second lines 262, and the third lines 263, the first line 261 and the second line 262 adjacent to each other in a second direction X that is perpendicular to the first direction Y may overlap each other as shown in FIGS. 12 and 13. The reason thereof is that, because the patterning slit sheet 130 and the substrate 2 are scanned some distance apart from each other, a formed organic layer is formed with some shadow as shown in FIG. 11.

If the first lines 261, the second lines 262, and the third lines 263 are formed using the deposition method as described above, shadow formation on an organic layer is inevitable. Therefore, as shown in FIGS. 12 and 13, the first line 261 and the second line 262 that are adjacent to each other in the second direction X partially overlap each other, the second line 262 and the third line 263 adjacent to each other in a second direction D2 partially overlap each other, and the third line 263 and the first line 261 adjacent to each other in the second direction D2 partially overlap each other.

Here, the first line 261 and the second line 262, the second line 262 and the third line 263, and the third line 263 and the first line 261 overlap on the second insulation layer 24. In detail, the first line 261 and the second line 262 overlap each other at a first gap G1 between the first light-emitting regions 241 and the second light-emitting regions 242, and the second line 262 and the third line 263 overlap each other at a second gap G2 between the second light-emitting regions 242 and the third light-emitting regions 243.

Furthermore, the first lines 261 through the third lines 263 do not overlap openings of adjacent lines. In other words, the first lines 261 do not overlap second openings 242 that are openings covered by the adjacent second lines 262 and third openings 243 that are openings covered by the adjacent third lines 263. The second lines 262 do not overlap first openings 241 that are openings covered by the adjacent first lines 261 and the third openings 243 that are openings covered by the adjacent third lines 263. The third lines 263 do not overlap the first openings 241 that are covered by the adjacent first lines 261 and the second openings 242 that are openings covered by the adjacent second lines 262.

Figure 14:
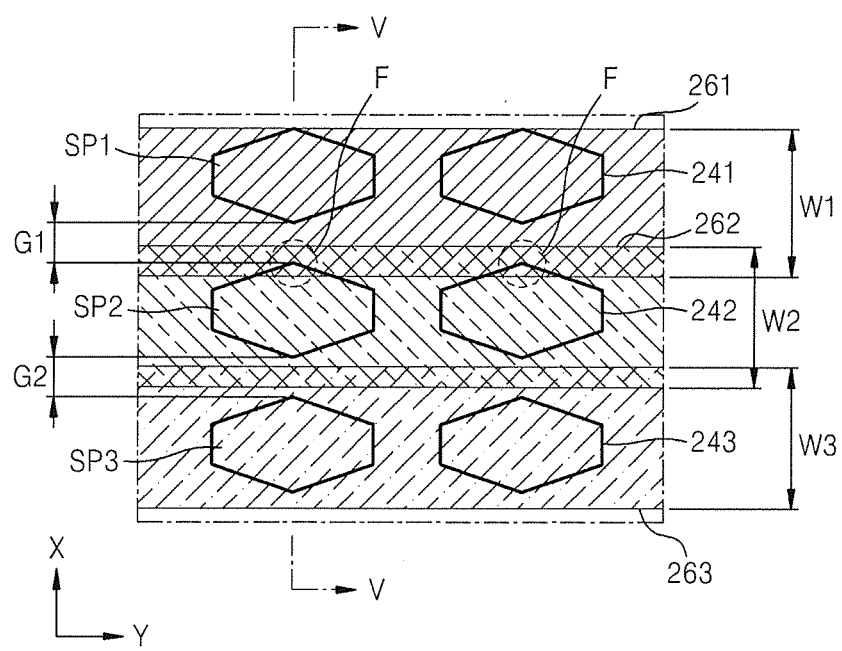
FIG. 14 is a plan view showing that color mixtures occurs in FIG. 12.
Figure 15:
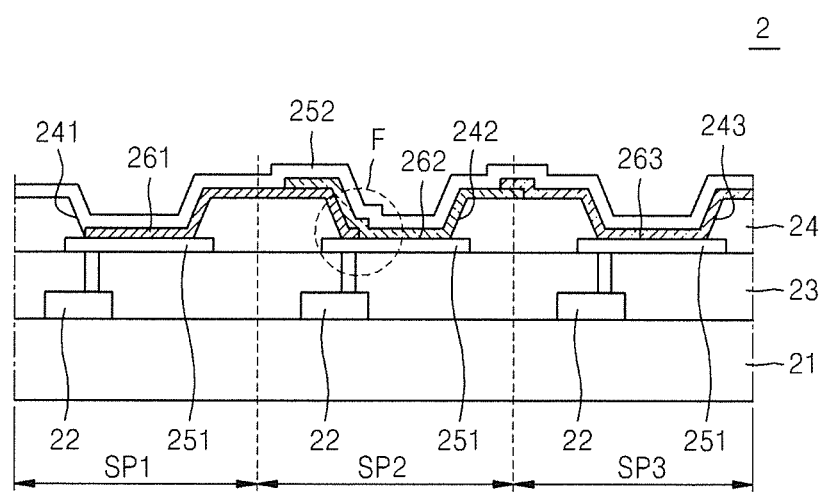
FIG. 15 is a cross-sectional view obtained along the line V-V of FIG. 14.

However, if subtle misalignment or significant shadow occurs between the substrate 2 and the patterning slit sheet 130, overlapping of lines adjacent to each other may extend into other light-emitting regions over the second insulation layer 24. Therefore, as shown in FIG. 14 and the portion F of FIG. 15, the first lines 261 extend into the second light-emitting regions 242 and cause color mixtures and stains in the second light-emitting regions 242. Due to the color mixtures and stains, problems including deterioration of light emitting efficiency and/or reduction of lifespan of an OLED may occur. Furthermore, a defective product with dislocated color coordinates and visible stains may be produced.

Therefore, embodiments of the present invention provide a light-emitting region for reducing color mixtures and stains in the first sub-pixels SP1, the second sub-pixels SP2, and the third sub-pixels SP3.

For example, according to embodiments of the present invention, in the first light-emitting regions 241 and the second light-emitting regions 242, a portion of the first light-emitting regions 241 and a portion of the second light-emitting regions 242 facing each other are not parallel to the first direction Y or edges of the first lines 261 or the second lines 262. To this end, if the first light-emitting regions 241 and the second light-emitting regions 242 have polygonal shapes with angled corners as shown in FIGS. 12 through 15, angled corners are located at where the first light-emitting regions 241 and the second light-emitting regions 242 face each other.

If, unlike in FIGS. 12 through 15, the portion of the second light-emitting regions 242 adjacent to the first lines 261 is parallel to the edge of the first lines 261 and the light-emitting regions have rectangular shapes, color mixtures and stains may occur at a larger area than in FIGS. 12 through 15 when the first lines 261 extend into the second light-emitting regions 242. However, to resolve the problem, if overlap lateral length of the second light-emitting regions 242 is reduced or width of the second light-emitting regions 242 in the second direction X is reduced, light-emitting area is reduced, and thus light-emitting efficiency is deteriorated.

However, according to embodiments of the present invention, color mixtures and stains due to adjacent lines may be minimized or reduced without deteriorating light-emitting efficiency.

Figure 16:
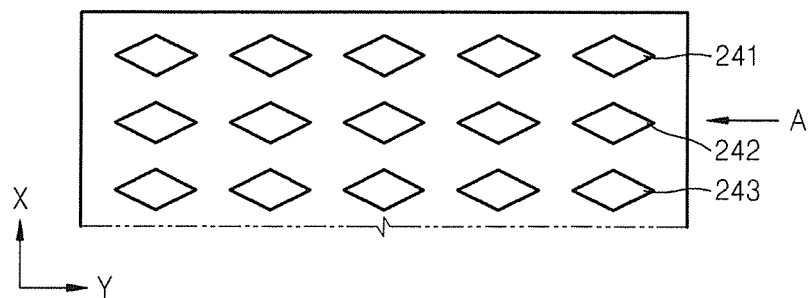
FIGS. 16 through 24 are plan views of organic light emitting display apparatuses according to other embodiments of the present invention.
Figure 17:
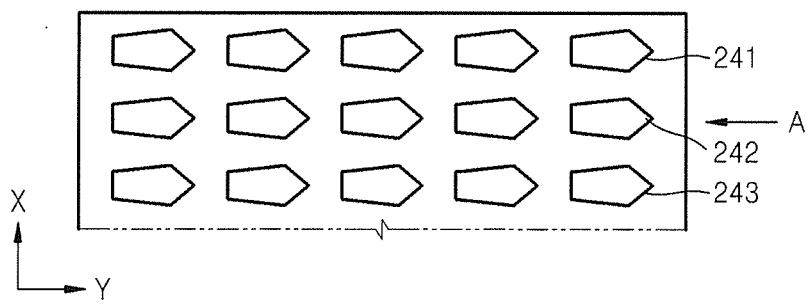

FIGS. 12 through 15 show that the first through third light-emitting regions 241, 242, and 243 have hexagonal honeycomb-like shapes. FIG. 16 shows that the first through third light-emitting regions 241, 242, and 243 have rhombus-like shapes. FIG. 17 shows that the first through third light-emitting regions 241, 242, and 243 have pentagonal shapes. As shown in FIGS. 12 through 17, if the first through third light-emitting regions 241, 242, and 243 have polygonal shapes with angled corners, an angled corner is located at where portions of the first light-emitting regions 241 and second light-emitting regions 242 face each other. Therefore, even if an adjacent line extends into another light-emitting region as shown in FIG. 14, an area at which color mixture occurs may be reduced.

Figure 18:
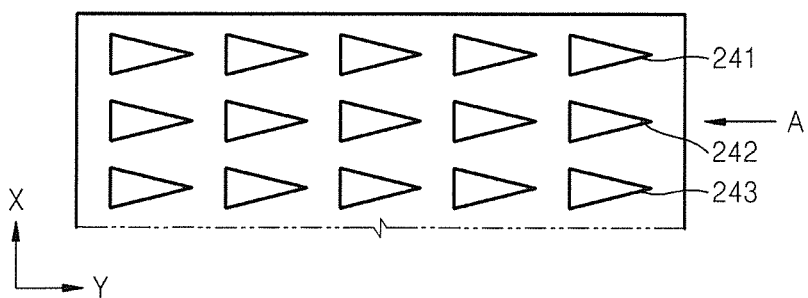
Figure 19:
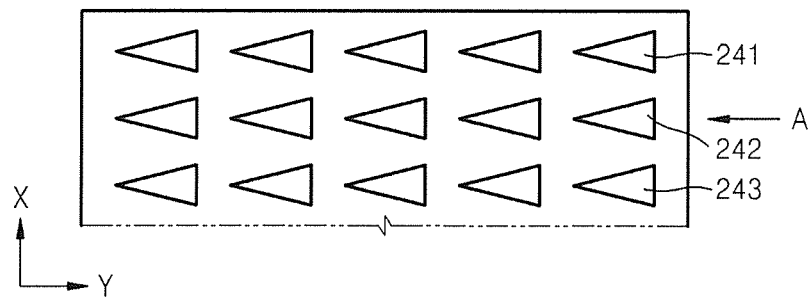
Figure 20:
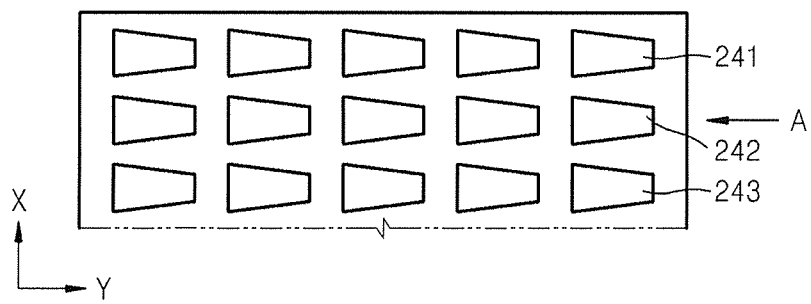

Meanwhile, if the first through third light-emitting regions 241, 242, and 243 have triangular shapes as shown in FIGS. 18 and 19 or the first through third light-emitting regions 241, 242, and 243 have trapezoidal shapes as shown in FIG. 20, portions of the first light-emitting regions 241 and the second light-emitting regions 242 facing each other are not parallel to each other. Therefore, even if an adjacent line extends into another light-emitting region as shown in FIG. 14, an area at which color mixture occurs may be reduced.

Figure 21:
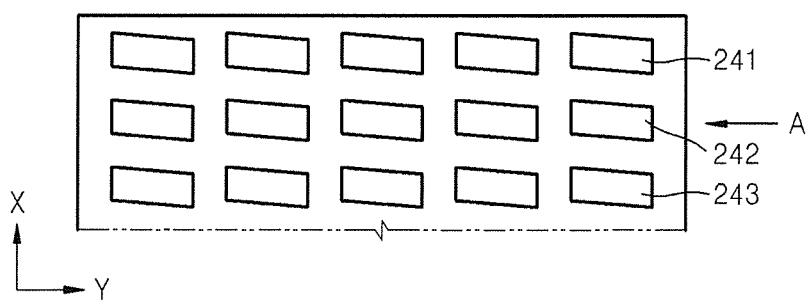

Furthermore, if the first through third light-emitting regions 241, 242, and 243 have parallelogram-like shapes as shown in FIG. 21, portions of the first light-emitting regions 241 and the second light-emitting regions 242 facing each other are not parallel to edges of the lines (261, 262, and 263 of FIG. 14). Therefore, even if an adjacent line extends into another light-emitting region as shown in FIG. 14, an area at which color mixture occurs may be reduced.

Figure 22:
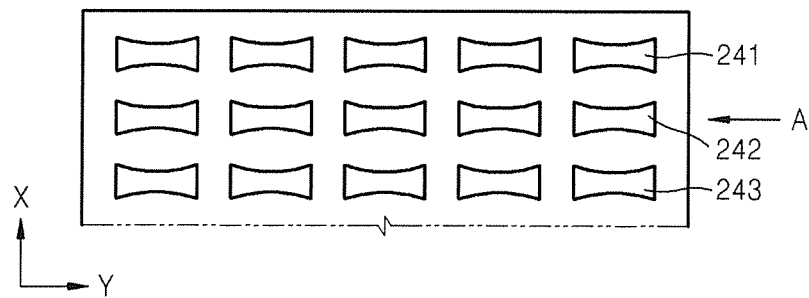
Figure 23:
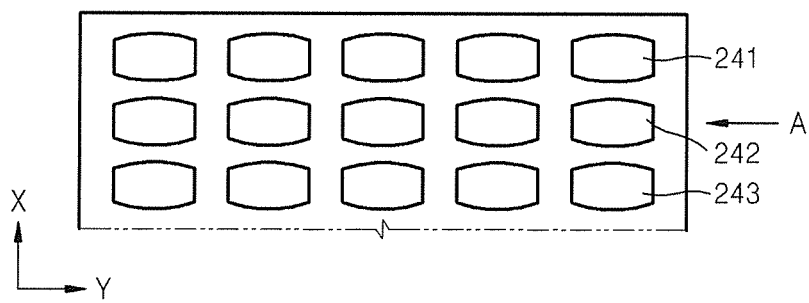
Figure 24:
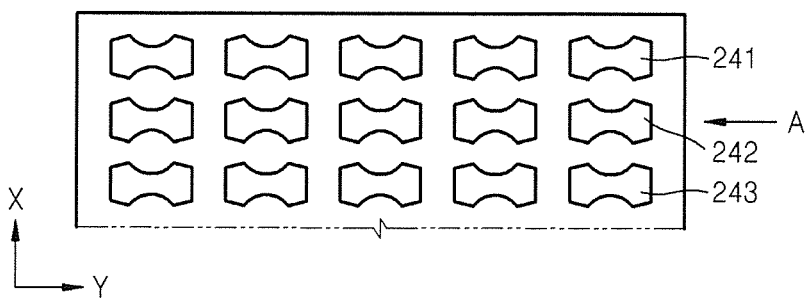

Furthermore, if the first through third light-emitting regions 241, 242, and 243 have shapes including curved lines as shown in FIGS. 22-24, the curved lines are located at where portions of the first light-emitting regions 241 and the second light-emitting regions 242 face each other. Therefore, even if an adjacent line extends into another light-emitting region as shown in FIG. 14, an area at which color mixture occurs may be reduced.

Although the above descriptions are given in relation to the first lines 261 and the second lines 262 and the first light-emitting regions 241 and the second light-emitting regions 242 for convenience of explanation, the present invention may also be identically applied in relation to the second lines 262 and the third lines 263 and the second light-emitting regions 242 and the third openings 243, and in relation to the first lines 261 and the third lines 263 and the first light-emitting regions 241 and the third light-emitting regions 243.

The present invention is not limited to the embodiments shown in FIGS. 12 through 24, and any of various shapes may be applied to the light-emitting regions of the present invention as long as color mixtures due to adjacent lines may be minimized. Furthermore, the light-emitting regions on a single substrate may have a combination of the above shapes.

Meanwhile, widths W1, W2, and W3 of the lines 261, 262, and 263 may be the same or may differ from one another according to shadow effectiveness. Meanwhile, the gaps G1 and G2 may be formed in any of various manners based on various factors including widths of lines and the overall pixel size.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting display apparatus comprising:
a substrate;
an insulation layer on the substrate and having a plurality of first openings defining first light-emitting regions that are arranged along a first direction and a plurality of second openings defining second light-emitting regions that are adjacent to the first light-emitting regions and are arranged along the first direction;
first lines on the insulation layer to cover the first light-emitting regions and comprising first organic light-emitting layers; and
second lines on the insulation layer to cover the second light-emitting regions and comprising second organic light-emitting layers different from the first organic light-emitting layers,
wherein an edge portion of the first light-emitting regions and an edge portion of the second light-emitting regions facing each other and extending parallel to a surface of the substrate are not parallel to the first direction, and
wherein the first lines and the second lines overlap each other at least partially in a plan view.

2. The organic light emitting display apparatus of claim 1, wherein the edge portions of the first light-emitting regions and the second light-emitting regions facing each other are not parallel to edges of the first lines and the second lines.

3. The organic light emitting display apparatus of claim 1, wherein the first light-emitting regions and the second light-emitting regions have polygonal shapes with angled corners, and
the first light-emitting regions and the second light-emitting regions each have an angled corner that is located at where the edge portions of the first light-emitting regions and the second light-emitting regions face each other.

4. The organic light emitting display apparatus of claim 1, wherein the first light-emitting regions and the second light-emitting regions have shapes including curved lines, and
at least one of the curved lines is located at where the edge portions of the first light-emitting regions and the second light-emitting regions face each other.

5. The organic light emitting display apparatus of claim 1, wherein the edge portions of the first light-emitting regions and the second light-emitting regions facing each other are not parallel to each other.

6. The organic light emitting display apparatus of claim 1, wherein the first organic light-emitting layer is formed by using an organic layer deposition apparatus, and
a slanted side between top and bottom sides of the first organic light-emitting layer that is farther from a center of one of the first light-emitting regions is longer than another slanted side between the top and bottom sides.

7. The organic light emitting display apparatus of claim 1, wherein the first organic light-emitting layer is formed by using an organic layer deposition apparatus, and a length of a slanted side between top and bottom sides of the first organic light-emitting layer formed farther from a center of one of the first light-emitting regions is larger than lengths of slanted sides between respective top and bottom sides of other ones of the first organic light-emitting layers formed close to the center of the one of the first light-emitting regions.

8. The organic light emitting display apparatus of claim 1, wherein the first organic light-emitting layer is formed by using an organic layer deposition apparatus, and two opposite slanted sides between top and bottom sides of the first organic light-emitting layer at a center of one of the first light-emitting regions have substantially the same length.

9. The organic light emitting display apparatus of claim 1, wherein the first organic light-emitting layer is formed by using an organic layer deposition apparatus, and the first organic light-emitting layers at one of the first light-emitting regions are substantially symmetrically arranged about a center of the one of the first light-emitting regions.

10. The organic light emitting display apparatus of claim 1, wherein the substrate has a size of 40 inches or more.

11. The organic light emitting display apparatus of claim 1, wherein the first and second organic light-emitting layers have a non-uniform thickness.

12. The organic light emitting display apparatus of claim 1, wherein each of the first light-emitting regions are defined by at least three edge portions, and at least two of the edge portions of each of the first light-emitting regions have lengths that are different from each other.

13. The organic light emitting display apparatus of claim 1, wherein a length of the first light-emitting regions in the first direction is greater than a width of the first light-emitting regions in a direction crossing the first direction.

14. A method of manufacturing an organic light emitting display apparatus, the method comprising:

forming an insulation layer on a substrate;

forming a first plurality of openings defining first light-emitting regions that are arranged along a first direction and a second plurality of openings defining second light-emitting regions that are adjacent to the first regions and are arranged along the first direction in the insulation layer;

forming first lines including first organic light-emitting layers on the insulation layer to cover the first light-emitting regions by moving the substrate in relation to a first deposition assembly that is spaced from the substrate, such that a first organic light-emitting material emitted from the first deposition assembly is deposited on the substrate; and forming second lines including second organic light-emitting layers different from the first organic light-emitting layers on the insulation layer to cover the second light-emitting regions by moving the substrate in relation to a second deposition assembly that is spaced from the substrate, such that a second organic light-emitting material different from the first organic light-emitting material emitted from the second deposition assembly is deposited on the substrate, wherein an edge portion of the first light-emitting regions and an edge portion of the second light-emitting regions facing each other and extending parallel to a surface of the substrate are not parallel to the first direction, and wherein the first lines and the second lines overlap each other at least partially in a plan view.

15. The method of claim 14, wherein the first light-emitting regions and the second light-emitting regions have polygonal shapes with angled corners, and the first light-emitting region and the second light-emitting regions each have an angled corner that is located at where the edge portions of the first light-emitting regions and the second light-emitting regions face each other.

16. The method of claim 14, wherein the first light-emitting regions and the second light-emitting regions have shapes including curved lines, and at least one of the curved lines is located at where the edge portions of the first light-emitting regions and the second light-emitting regions face each other.

17. The method of claim 14, wherein the edge portions of the first light-emitting regions and the second light-emitting regions facing each other are not parallel to each other.

18. The method of claim 14, wherein the first deposition assembly comprises:

a deposition source configured to emit a deposition material;

a deposition source nozzle unit at one side of the deposition source and comprising a plurality of deposition source nozzles; and a patterning slit sheet facing the deposition source nozzle unit and comprising a plurality of patterning slits, and the first organic light-emitting material emitted by the deposition source passes through the patterning slit sheet and is deposited to form the first organic light-emitting layers.

19. The method of claim 18, wherein the patterning slit sheet is smaller than the substrate in at least one of the first direction or a second direction perpendicular to the first direction.

20. The method of claim 18, wherein the plurality of deposition source nozzles are arranged at the deposition source nozzle unit along the first direction, the plurality of patterning slits are arranged at the patterning slit sheet along the first direction, and the first deposition assembly further comprises a shielding plate assembly comprising a plurality of shielding plates arranged between the deposition source nozzle unit and the patterning slit sheet along the first direction and partitioning a space between the deposition source nozzle unit and the patterning slit sheet into a plurality of deposition spaces.

21. The method of claim 18, wherein the plurality of deposition source nozzles are arranged at the deposition source nozzle unit along the first direction, and the plurality of patterning slits are arranged at the patterning slit sheet along a second direction perpendicular to the first direction.

22. The method of claim 21, wherein the deposition source, the deposition source nozzle unit, and the patterning slit sheet are connected to one another via a connecting member and are formed as a single body.

23. The method of claim 22, wherein the connecting member guides a path in which the deposition material moves.

24. The method of claim 18, wherein the forming of the first lines and the forming of the second lines respectively comprise depositing on the substrate the first organic light-emitting material and the second organic light-emitting material emitted respectively by the deposition source of the first deposition assembly and a deposition source of the second deposition assembly while the substrate is spaced from and is being moved with respect to the first and second deposition assemblies of a thin-film deposition apparatus, the thin-film deposition apparatus comprising:
- a conveyer unit comprising a transfer unit on which the substrate is fixed to move therewith;
- a first conveyer unit, which moves the transfer unit on which the substrate is fixed in a first direction; and
- a second conveyer unit, which moves the transfer unit from which the substrate is detached after deposition in a direction opposite to the first direction;
- a loading unit in which the substrate is fixed to the transfer unit;
- a deposition unit comprising:
    - a chamber maintained at a vacuum; and
    - the first and second deposition assemblies; and
- an unloading unit in which the substrate is detached from the transfer unit after the substrate passes through the deposition unit and deposition thereon is completed.

25. The method of claim 24, wherein the transfer unit is configured to move back and forth between the first conveyer unit and the second conveyer unit, and
the substrate fixed to the transfer unit is spaced apart from the first and second deposition assemblies while being transported by the first conveyer unit.

26. The method of claim 25, wherein the first conveyer unit moves the transfer unit to the loading unit, the deposition unit, and the unloading unit in the order stated.

27. The method of claim 24, wherein the first conveyer unit and the second conveyer unit pass through the deposition unit.

28. The method of claim 24, wherein the first conveyer unit and the second conveyer unit are arranged next to each other in a vertical direction.

* * * * *